(12) United States Patent
Scott et al.

(10) Patent No.: US 9,584,085 B2
(45) Date of Patent: Feb. 28, 2017

(54) AMPLIFYING SYSTEM

(71) Applicant: RF Micro Devices, Inc., Greensboro, NC (US)

(72) Inventors: Baker Scott, San Jose, CA (US); George Maxim, Saratoga, CA (US); Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/554,542

(22) Filed: Nov. 26, 2014

(65) Prior Publication Data

US 2015/0155843 A1     Jun. 4, 2015

Related U.S. Application Data

(60) Provisional application No. 61/909,028, filed on Nov. 26, 2013.

(51) Int. Cl.
*H03G 3/30*     (2006.01)
*H03F 3/68*     (2006.01)
(Continued)

(52) U.S. Cl.
CPC ......... *H03G 3/3036* (2013.01); *H03F 1/0211* (2013.01); *H03F 1/0272* (2013.01); *H03F 1/223* (2013.01); *H03F 1/32* (2013.01); *H03F 1/523* (2013.01); *H03F 1/565* (2013.01); *H03F 3/19* (2013.01); *H03F 3/193* (2013.01); *H03F 3/45179* (2013.01); *H03F 3/45394* (2013.01); *H03F 3/68* (2013.01); *H04B 1/0475* (2013.01); *H03F 2200/324* (2013.01);
(Continued)

(58) Field of Classification Search
USPC ................... 330/285, 283, 310, 98, 133, 150
See application file for complete search history.

(56) References Cited

U.S. PATENT DOCUMENTS 8,035,443 B2 * 10/2011 Narathong .............. H03F 1/301
                                                                           330/278
8,253,496 B2 * 8/2012 Ichitsubo ................ H03F 3/195
                                                                           330/136
(Continued)

*Primary Examiner* — Hieu Nguyen
(74) *Attorney, Agent, or Firm* — Withrow & Terranova, P.L.L.C.

(57) ABSTRACT

An amplifying system with increased linearity is disclosed. The amplifying system includes a first gain stage with a first gain characteristic, a second gain stage with a second gain characteristic, and bias circuitry configured to substantially maintain alignment of distortion inflection points between the first gain characteristic and the second gain characteristic during operation. The bias circuitry is configured to further maintain alignment of the distortion inflection points between the first gain characteristic and the second gain characteristic over design corners by providing substantially constant headroom between quiescent bias voltage and turnoff of the first gain stage and the second gain stage. In some embodiments the first gain characteristic is expansive and the second gain characteristic is compressive. In other embodiments the first gain characteristic is compressive and the second gain characteristic is expansive. In some embodiments the first gain stage is configured to provide RF degeneration control of gain.

27 Claims, 19 Drawing Sheets

(51) Int. Cl.
*H03F 3/19* (2006.01)
*H03F 1/32* (2006.01)
*H03F 1/52* (2006.01)
*H03F 1/02* (2006.01)
*H04B 1/04* (2006.01)
*H03F 1/22* (2006.01)
*H03F 1/56* (2006.01)
*H03F 3/45* (2006.01)
*H03F 3/193* (2006.01)

(52) U.S. Cl.
CPC .. *H03F 2200/387* (2013.01); *H03F 2200/451* (2013.01); *H03F 2200/471* (2013.01); *H03F 2201/3236* (2013.01); *H03G 3/3042* (2013.01); *H04B 2001/0408* (2013.01); *H04B 2001/0416* (2013.01); *H04B 2001/0425* (2013.01)

(56) References Cited

U.S. PATENT DOCUMENTS

2002/0005755 A1* 1/2002 Nam ................. H03F 1/32
                                                   330/133
2009/0174475 A1* 7/2009 Yuen ................ H03F 1/0216
                                                   330/133

* cited by examiner

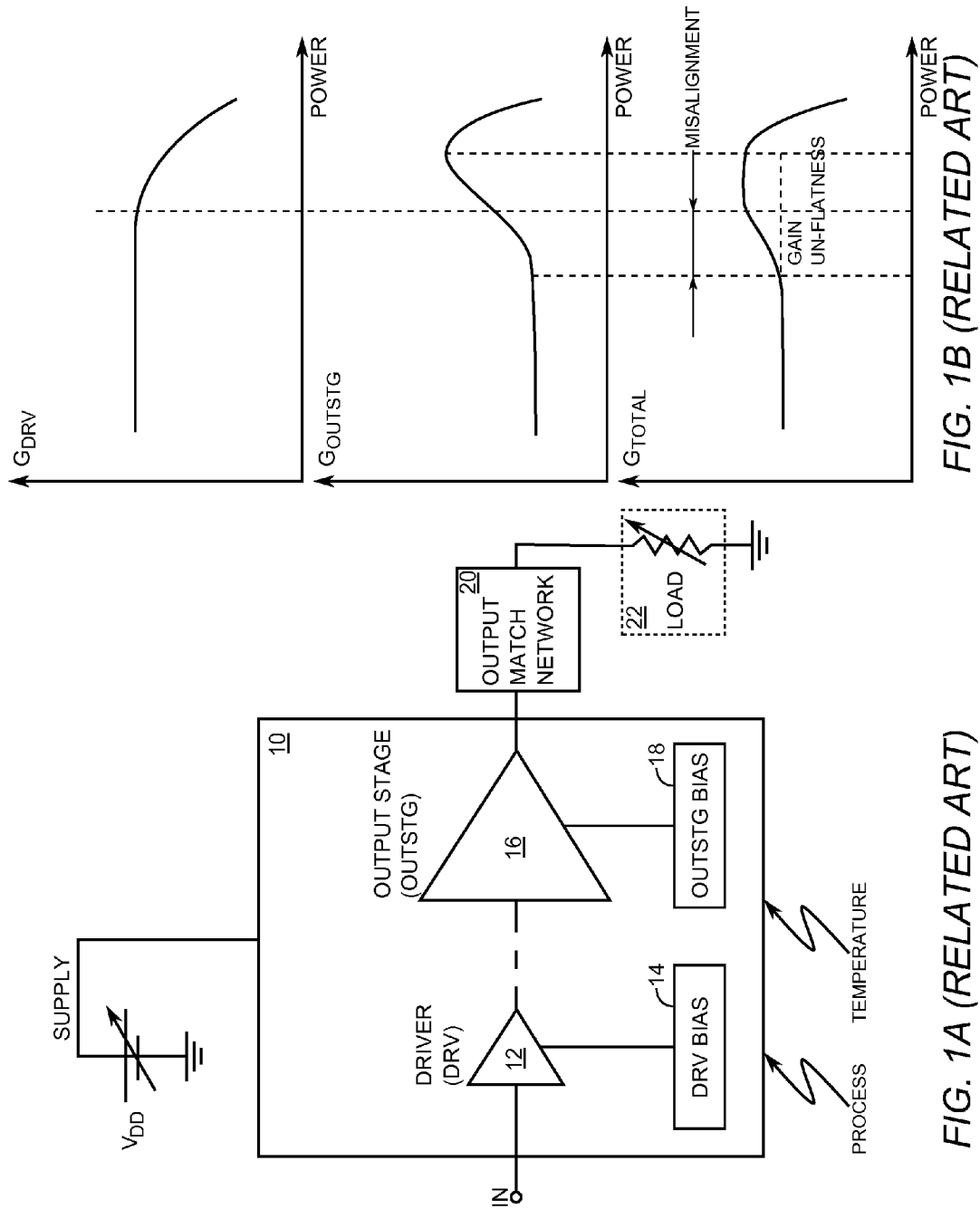

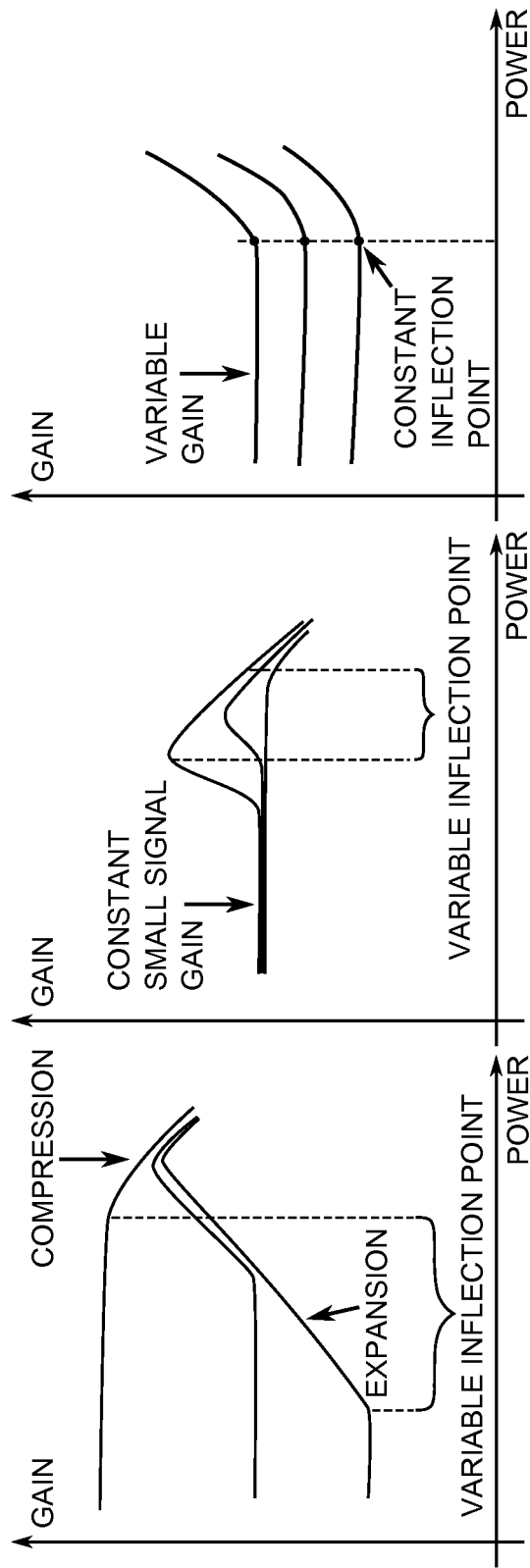

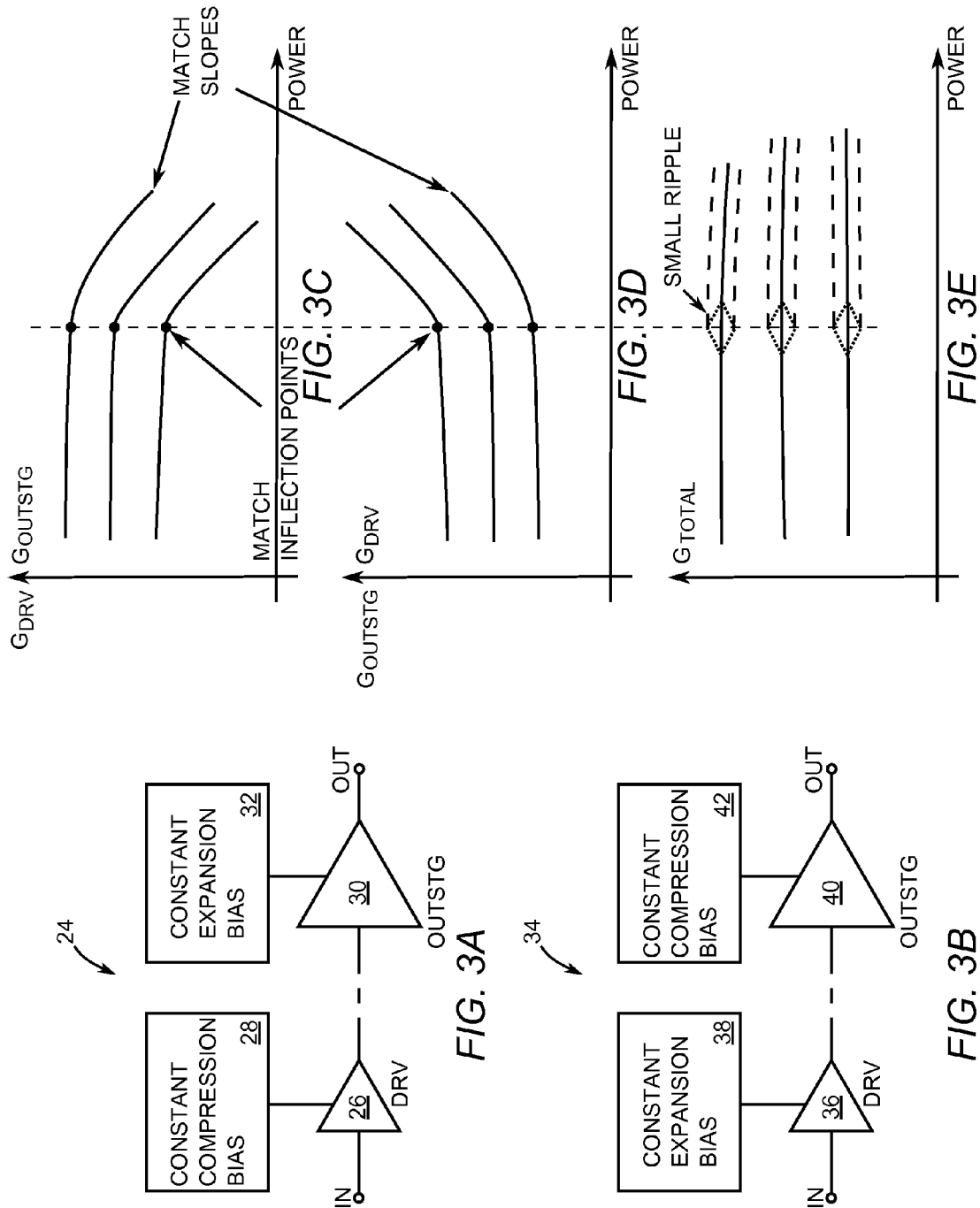

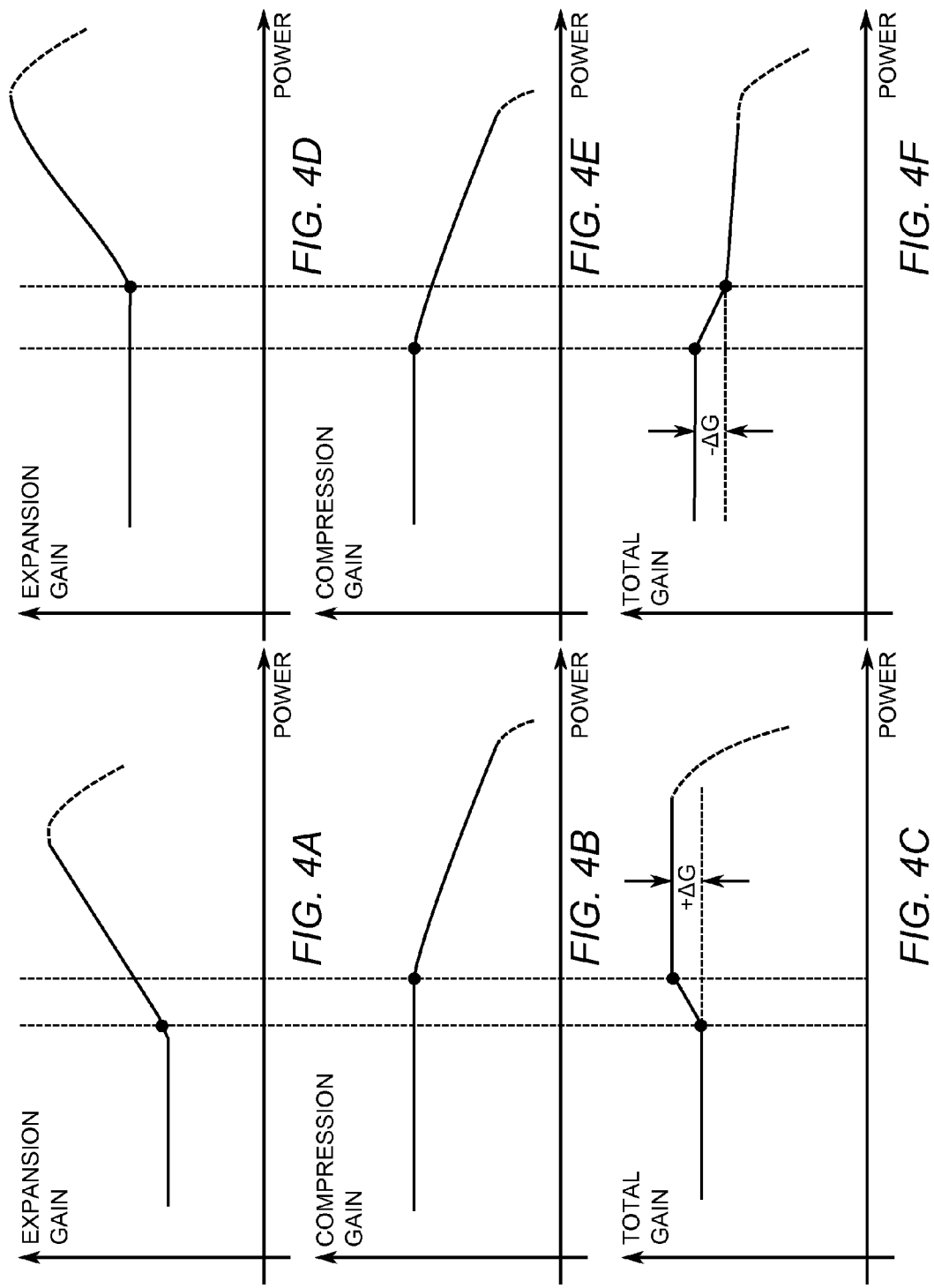

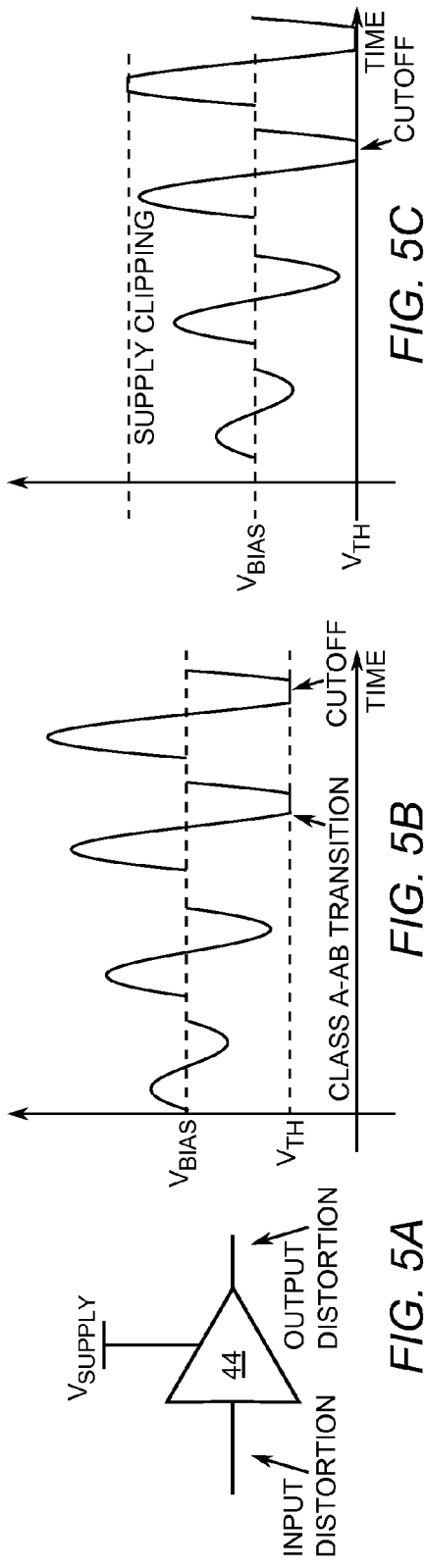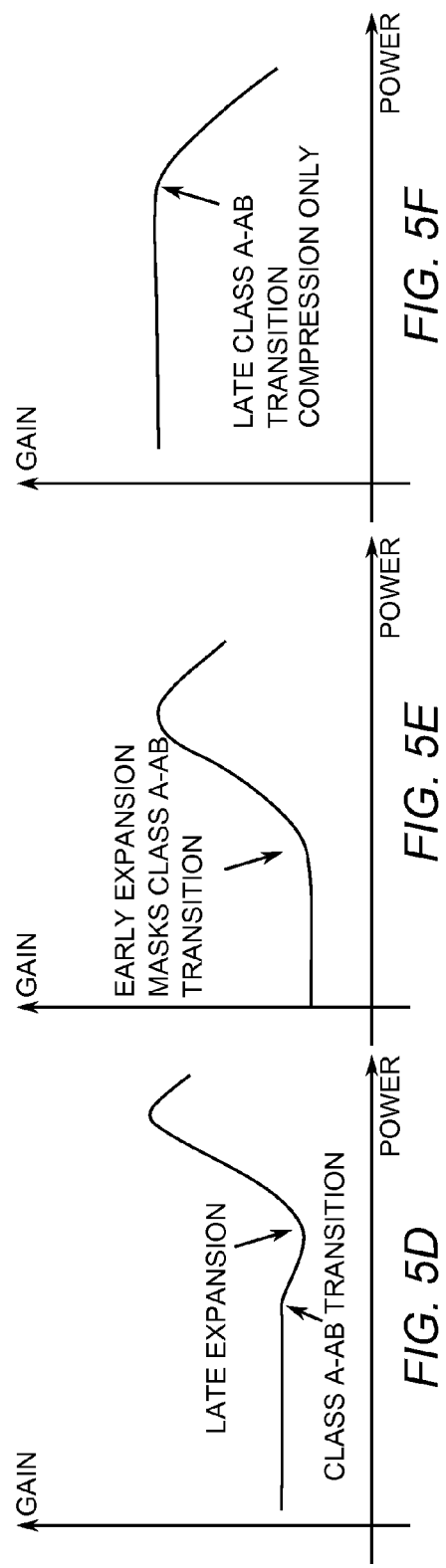

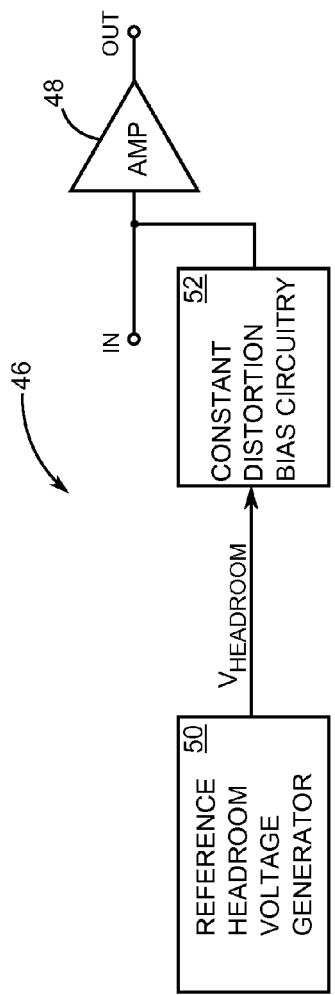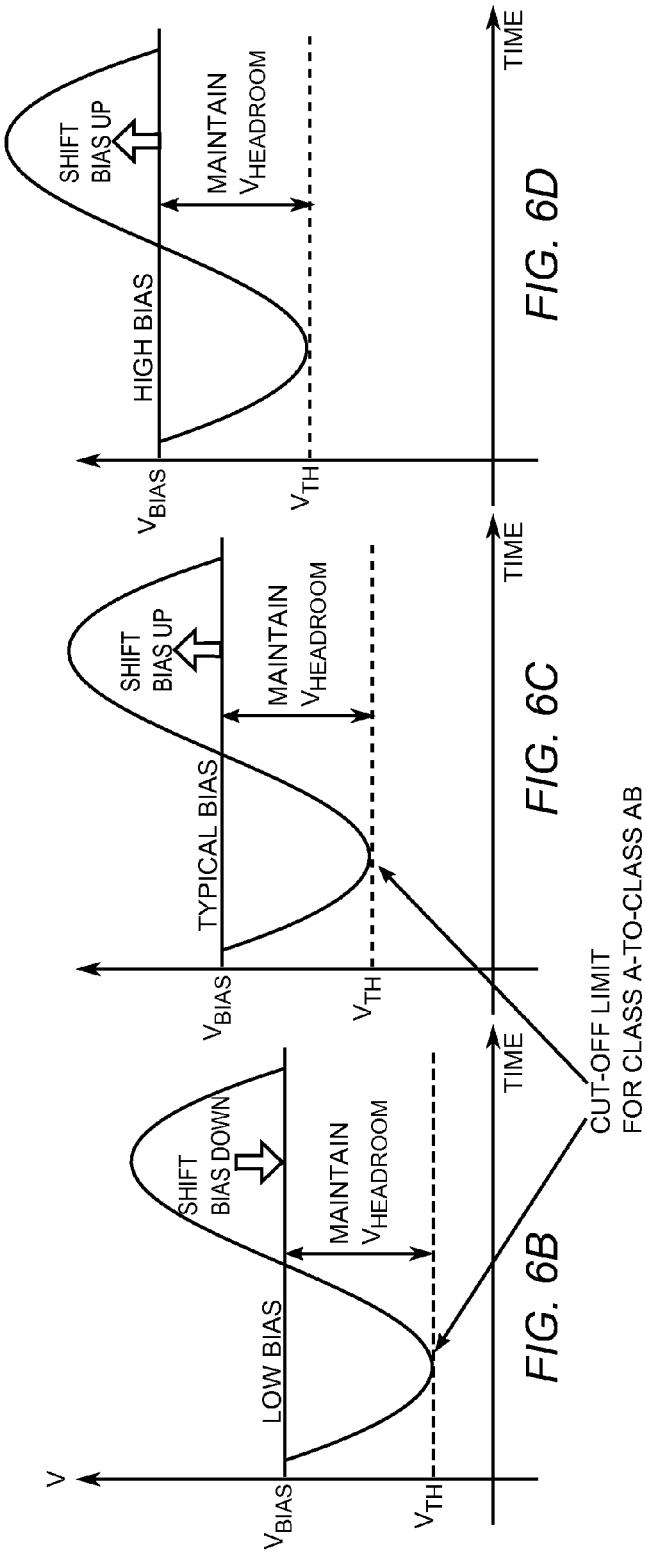

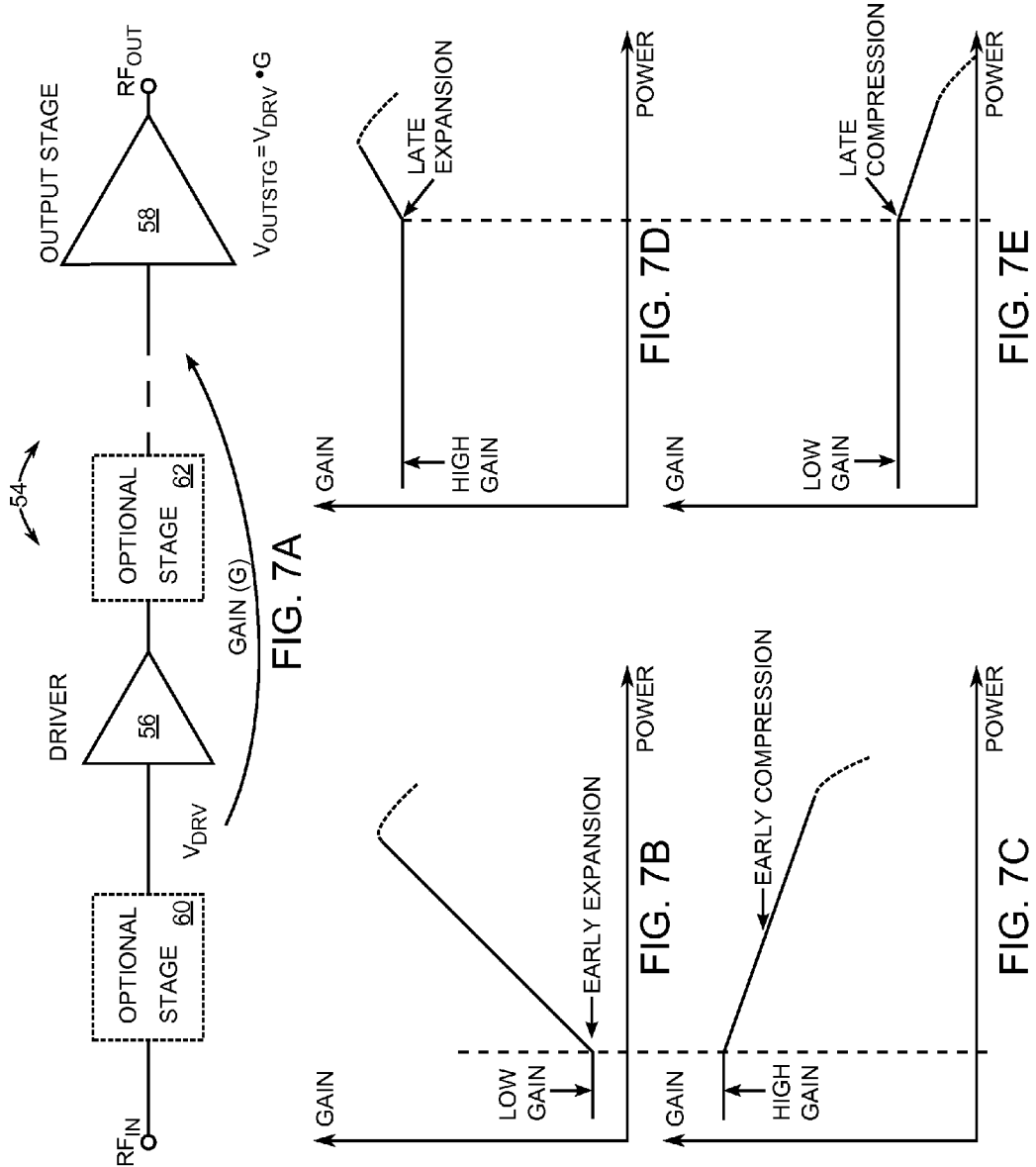

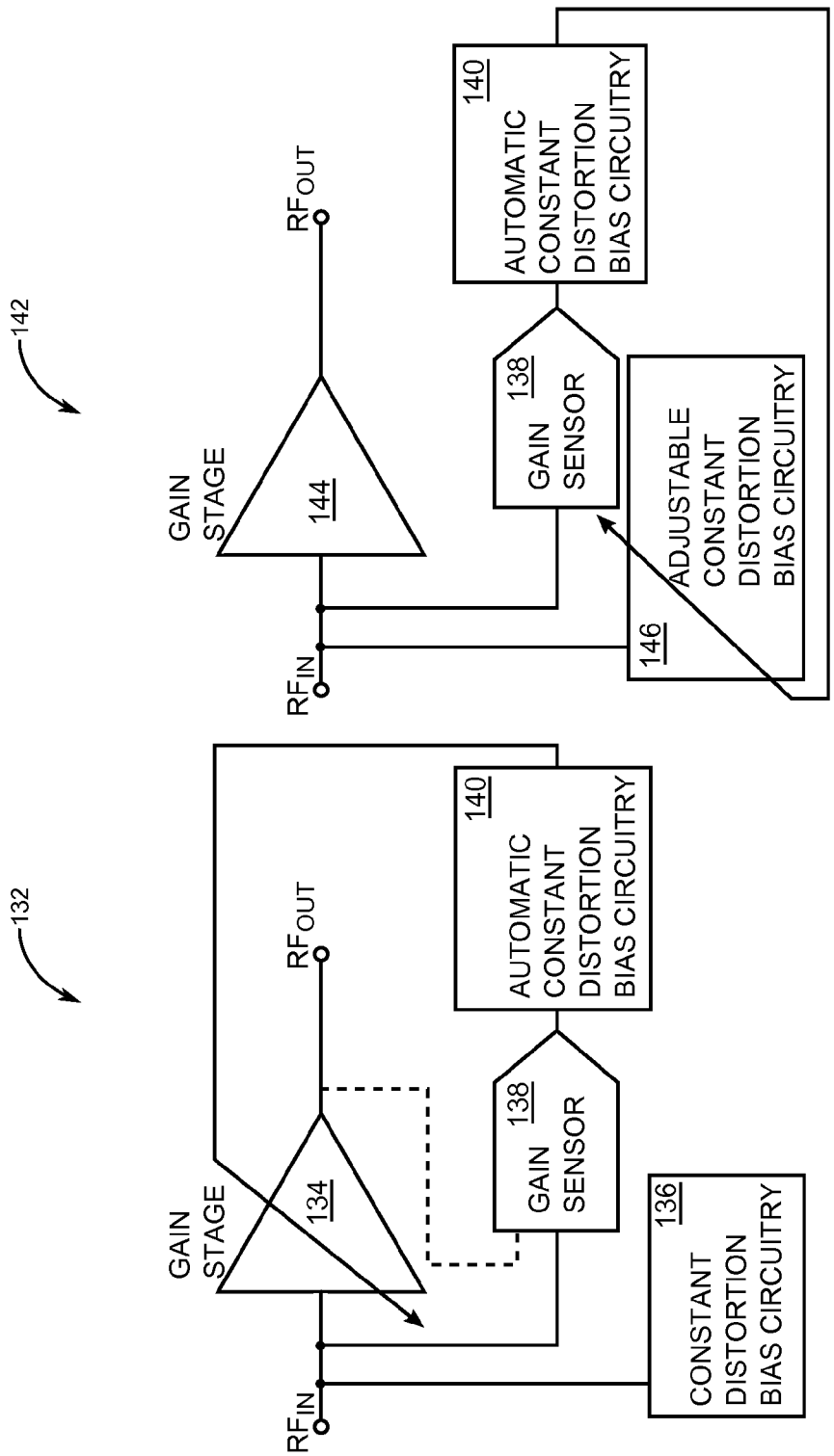

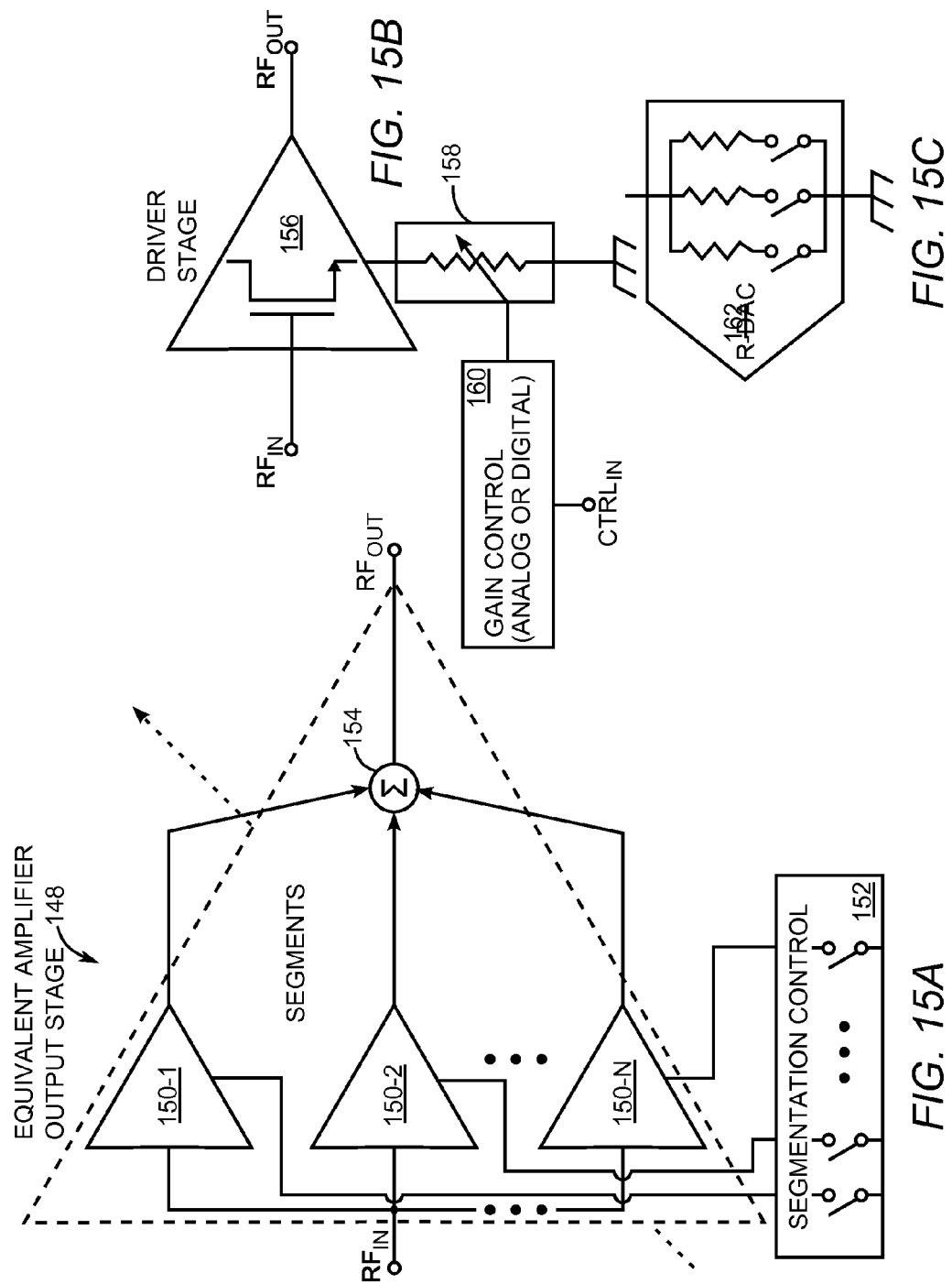

AMPLIFYING SYSTEM

RELATED APPLICATIONS

This application claims the benefit of U.S. provisional patent application No. 61/909,028, filed Nov. 26, 2013, the disclosure of which is incorporated herein by reference in its entirety.

FIELD OF THE DISCLOSURE

The present disclosure is directed to amplifying systems employed by electronic communication equipment.

BACKGROUND

Traditionally biased amplifier stages have gain curves with inflection points that vary over design corners such as process, temperature, and supply voltage. Therefore, traditionally biased amplifier stages are not well suited for linearization through expansion and compression cancellation, since traditionally biased amplifier stages do not track each other. As a result, there is a large distortion cancellation error over design corners. Thus, there remains a need for amplifying systems to realize gain curves with constant distortion inflection points over the design corners.

Moreover, traditional constant small signal gain biased amplifiers usually come with a large variation of distortion characteristics. Thus, traditional constant small signal gain biased amplifiers are not well suited to use in complementary distortion cancellation schemes that are considered for improving linearization. Constant distortion biased amplifiers come with stable distortion characteristics that can be used in expansion-compression cancellation schemes, but they have large small signal gain changes over design corners such as process, temperature, and supply voltage. Thus, a need remains for techniques to stabilize the gain in constant distortion biased stages.

SUMMARY

An amplifying system with increased linearity is disclosed. The amplifying system includes a first gain stage with a first gain characteristic, a second gain stage with a second gain characteristic, and bias circuitry configured to substantially maintain alignment of distortion inflection points between the first gain characteristic and the second gain characteristic during operation. The bias circuitry is configured to further maintain alignment of the distortion inflection points between the first gain characteristic and the second gain characteristic over design corners by providing constant headroom between quiescent bias voltage and turnoff of the first gain stage and the second gain stage. In some embodiments the first gain characteristic is expansive and the second gain characteristic is compressive. In additional embodiments the first gain characteristic is compressive and the second gain characteristic is expansive. In further embodiments the first gain stage is configured to provide RF degeneration control of gain.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1A is a block diagram of a related art power amplifier that has difficulty remaining linear over design corners such as process, temperature, and supply voltage variations.

FIG. 1B is a series of graphs with gain curves that depict a driver gain, an output stage gain and total gain for the related art power amplifier of FIG. 1A.

FIG. 2A is a gain versus power graph illustrating related art stage biasing using a constant bias current, which results in a large distortion inflection point and small signal gain variation over design corners.

FIG. 2B is a gain versus power graph illustrating a related art constant gm bias that offers a constant small signal gain over design corners.

FIG. 2C is a gain versus power graph illustrating variable gain with a constant inflection point that is achieved by embodiments of the present disclosure.

FIG. 3A is a simplified schematic diagram of an amplifying system of the present disclosure that includes a driver stage with constant compression bias and an output stage having constant expansion bias.

FIG. 3B is a simplified schematic diagram of an amplifying system of the present disclosure that includes a driver stage with constant expansion bias and an output stage having constant compression bias.

FIG. 3C is a graph of gain versus power for the driver stage of FIG. 3A and the output stage of FIG. 3B.

FIG. 3D is a graph of gain versus power for the driver stage of FIG. 3B and the output stage of FIG. 3A.

FIG. 3E is a graph of total gain versus power for either of the output stages of FIG. 3A and FIG. 3B.

FIG. 4A is a graph of early expansion gain versus power.

FIG. 4B is a graph of late compression gain versus power.

FIG. 4C is a graph of total gain versus power that illustrates a bump up in total gain as a result of misalignment of the early expansion gain of FIG. 4A and the late compression gain of FIG. 4B.

FIG. 4D is a graph of late expansion gain versus power.

FIG. 4E is a graph of early compression gain versus power.

FIG. 4F is a graph of total gain versus power that illustrates a bump down in total gain as a result of misalignment of the late expansion gain of FIG. 4D and the early compression gain of FIG. 4F.

FIG. 5A is a schematic of an amplifier stage that can be biased high to provide a relatively high saturation voltage or relatively low to provide a relatively low saturation voltage.

FIG. 5B is a graph of signal voltage versus time illustrating a clipping effect as a signal voltage increases to a point that a negative swing of the signal voltage intersects a threshold voltage of the amplifier of FIG. 5A.

FIG. 5C is a graph of signal voltage versus time illustrating a clipping effect as a supply voltage dips to a point that a positive swing of the signal voltage intersects the supply voltage of the amplifier of FIG. 5A.

FIG. 5D is a graph of gain versus power showing a late expansion during a class A-AB transition for the amplifier of FIG. 5A.

FIG. 5E is a graph of gain versus power showing an early expansion that masks a class A-AB transition for the amplifier of FIG. 5A.

FIG. 5F is a graph of gain versus power showing a class A-AB transition for the amplifier of FIG. 5A with compression only.

FIG. 6A is the schematic of an amplifying system that in accordance with the present disclosure includes an amplifier stage, a reference headroom voltage generator, and constant distortion bias circuitry.

FIG. 6B is a graph of signal voltage versus time wherein the signal voltage is offset by a relatively low bias voltage while having voltage headroom maintained by the amplifying system of FIG. 6A.

FIG. 6C is a graph of signal voltage versus time wherein the signal voltage is offset by a typical centered bias voltage while having voltage headroom maintained by the amplifying system of FIG. 6A.

FIG. 6D is a graph of signal voltage versus time wherein the signal voltage is offset by a relatively high bias voltage while having voltage headroom maintained by the amplifying system of FIG. 6A.

FIG. 7A is a schematic of an amplifier wherein a saturation voltage of a driver is related to a saturation voltage of an output stage that receives a signal from the driver.

FIG. 7B is a graph of gain versus power for a low gain followed by an early expansion.

FIG. 7C is a graph of gain versus power for a high gain followed by an early compression.

FIG. 7D is a graph of gain versus power for high gain followed by late expansion.

FIG. 7E is a graph of gain versus power for low gain followed by late compression.

FIG. 14A is a schematic of an exemplary amplifying system having a gain stabilization loop for constant biased amplifier stages using RF segmentation control.

FIG. 14B is a schematic of an exemplary amplifying system having a gain stabilization loop for constant biased amplifier stages using bias control.

FIG. 15A is a schematic of an exemplary amplifier output stage made up of amplifier segments that are selectively turned on and off by a digital segmentation control.

FIG. 15B is a schematic of an exemplary driver stage with gain degeneration implemented using a variable degeneration resistance that is controlled by a gain control.

FIG. 15C is a schematic of a resistive digital to analog converter (R-DAC) that can be used to control the gain of the driver stage of FIG. 15B.

DETAILED DESCRIPTION

Figure 8:
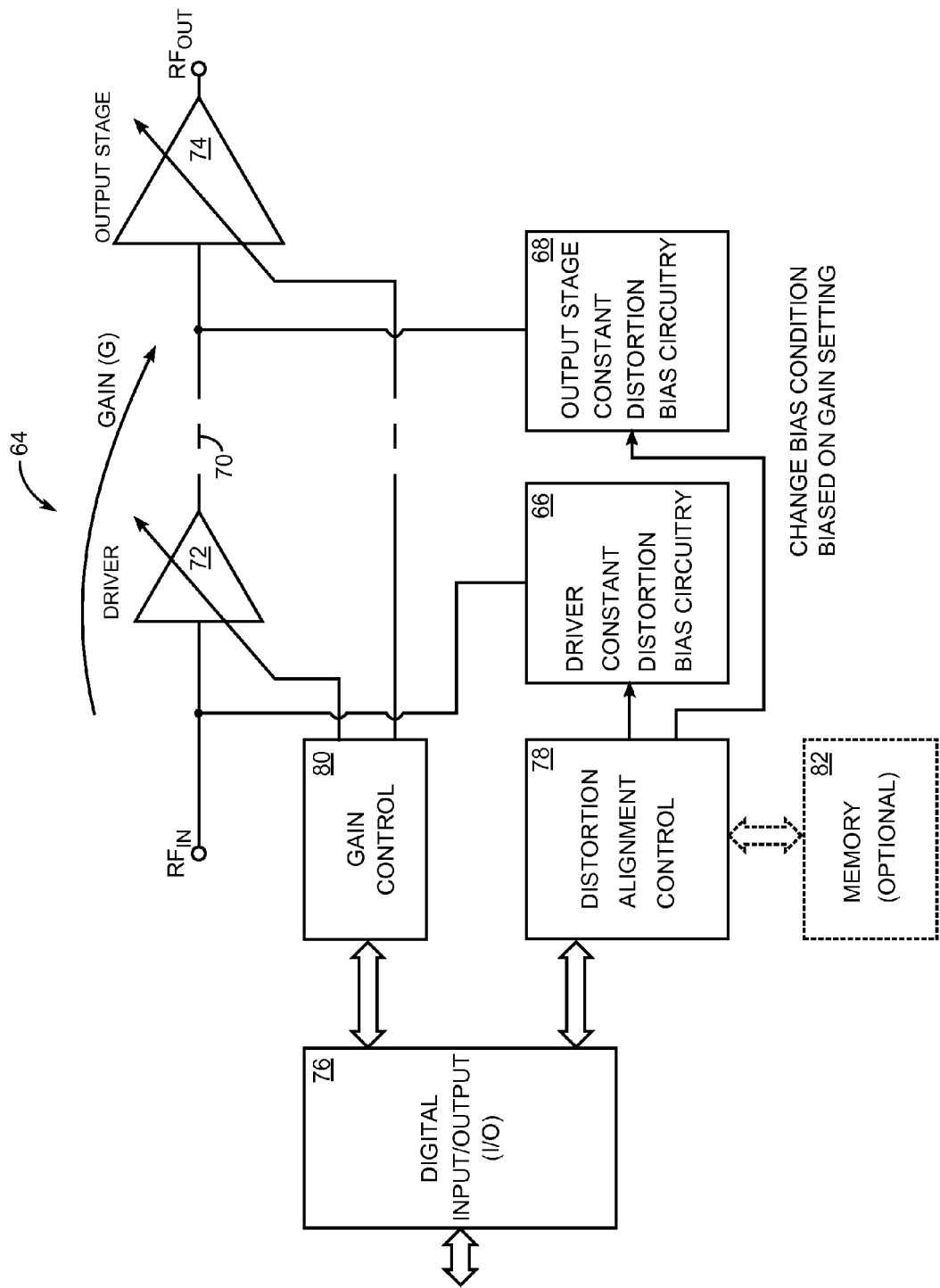
FIG. 8 is a schematic diagram of an exemplary embodiment of an amplifying system having driver constant distortion bias and an output stage constant distortion bias in a signal path having a variable gain driver stage and a variable gain output stage.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The present disclosure provides embodiments of an amplifying system that realizes gain curves with constant distortion inflection points over the design corners. In particular, the amplifying system of the present disclosure provides accurate linearization schemes based on gain expansion cancellation and gain compression cancellation. The disclosed schemes are based on a first method of keeping a constant overdrive voltage for amplifier stages in a main signal path and thus a fixed signal level when a transition between class A and class AB compression occurs. Moreover, a fixed signal level is also maintained when expansion occurs due to a transconductance gm increase. An increase in signal level causes an increase in gm. Further still, a second method disclosed for keeping the overdrive voltage constant can be realized by either using degeneration in the main signal path or in a DC bias network. The second method can be used in driver stages where efficiency is less important, while the first method is more appropriate for output stages where efficiency is the key performance specification.

When two or more stages are connected in cascade, their overdrive voltages, the signal level and thus, the gain between them that keeps the expansion and compression inflection points aligned, are interdependent. In the case of amplifiers with variable gain that are controlled either continuously or with different gain settings, the overdrive voltage needs to be adjusted based on the gain settings that give the required signal level at the input of each stage. The stage that has the expansion and the stage that has the compression are determined by the specific performance of the signal path. In one embodiment, the output stage is debiased to achieve lower quiescent current that results in gain expansion. In such a case, the driver is the stage that needs to have gain compression. In contrast, if the output stage is operated at relatively large quiescent current, then the expansion may not be realized and the output stage will have a predominantly compressing characteristic. In this case, the driver will have the expansion characteristic. If one stage has both expansion and compression at different power levels, then the other stage needs to have a matching inverse compression and then expansion to achieve an overall flat gain curve, which will lead to relatively good AM-AM linearization.

Moreover, the present disclosure also provides techniques to stabilize the gain in constant distortion biased stages. The techniques include a closed feedback loop that senses the gain and changes an element in the amplifier to keep gain constant. Also, gain sensing can be performed in the bias stage or using replica gain stages and the gain can be controlled via segmentation, degeneration or a combination of the two. Further still, gain control can be realized using analog or digital/mixed-signal techniques. The gain control can be stored in memory look-up tables and then selected based on the given operation corner. Alternatively, an analog circuit can generate the needed gain control. The following description provides details for the preceding general discussion.

FIG. 1A is a block diagram of a related art power amplifier 10 that has difficulty remaining linear over design corners such as process, temperature, and supply voltage variations. The related art power amplifier 10 includes a driver stage 12 with driver bias circuitry 14 and an output stage 16 with output stage bias circuitry 18. An output match network 20 matches output stage impedance with a load impedance associated with a load 22.

The architecture of the related art power amplifier 10 is relatively standard and applies to many different types of power amplifier technologies. For example, the related art power amplifier 10 can be complementary metal oxide semiconductor (CMOS), bipolar, silicon-germanium, and gallium arsenide (GaAs) technologies. In general, biasing levels for these various technologies will be different. However, biasing techniques presented in this disclosure are applicable to the technologies listed. In general, the biasing techniques of the present disclosure maintain alignment of gain inflection points between the driver stage 12 and the output stage 16.

During operation of the related art power amplifier 10, one of the driver stage 12 and the output stage 16 generally compresses gain harder for a given input power level. Typically, the stage that compresses gain harder for a given input power level is the output stage 16. Moreover, the output stage 16 handles most of the power and as the power reaches peak power, compression becomes severe and the amount of linear power achievable by the output stage 16 is limited.

Another constraint for power amplifiers such as the related art power amplifier 10 is that they typically operate at a low bias level. This is because operation at small signal levels would waste significant amounts of power at higher bias levels. Therefore, to maintain efficiency, the output stage 16 is debiased to operate at a relatively very low quiescent current when small signal levels are applied.

In this regard, FIG. 1B provides a series of graphs with gain curves that depict a driver gain, an output stage gain and a total gain for the related art power amplifier 10 of FIG. 1A. Inflection points for the gain curves in FIG. 1B are indicated by vertical dashed lines. The top graph of FIG. 1B shows that the driver gain $G_{DRV}$ is flat until input power reaches an inflection point where the driver gain $G_{DRV}$ begins compressing. The middle graph of FIG. 1B shows that the output stage gain $G_{OUTSTG}$ begins at a small signal gain level and then starts to expand as signal level increases. The reason for the expansion in gain is that current in the output stage 16 increases with signal level beginning at about mid-power. The increase in current gives rise to the transconductance gm, which in turn results in increased output stage gain $G_{OUTSTG}$. However, at some point the output stage gain $G_{OUTSTG}$ begins to compress because of a finite level of supply voltage $V_{DD}$. As a result, the shape of the output stage gain $G_{OUTSTG}$ depicted in the middle graph of FIG. 1B is typical for related art output stages such as related art output stage 16.

The bottom graph of FIG. 1B depicts the total gain $G_{Total}$ of the related art power amplifier 10. A misalignment between compression and expansion inflection points of the driver gain $G_{DRV}$ and the output stage gain $G_{OUTSTG}$ usually occurs when there is a change in process, temperature, or supply voltage $V_{DD}$. The misalignment between compression and expansion inflection points of the driver gain $G_{DRV}$ and the output stage gain $G_{OUTSTG}$ results in gain un-flatness that leads to nonlinear operation within a region of misalignment.

The misalignment between compression and expansion inflection points can be realigned by providing the driver stage 12 with an inverse gain characteristic that provides a flat gain until the expansion inflection point of the output stage gain $G_{OUTSTG}$ occurs. Once the expansion inflection point is reached, the driver stage 12 begins gain compression, which results in a relatively much improved linear range of operation. In effect, the expansion and compression points would be aligned. However, traditional biasing schemes do not allow for such a realignment of gain inflection points. In order to understand this fact it is helpful to review some traditional techniques for biasing the related art power amplifier 10.

One of the most common ways to bias an amplifier stage is to bias it at a fixed current. However, the gain of a fixed current biased amplifier stage will fluctuate over process because the gain is dependent, for example, in a metal oxide semiconductor (MOS) device on the transconductance gm, which changes with channel width W and length L, oxide thickness (Tox), and electron mobility. Furthermore, gain distortion will change because of a dependence upon drain saturation voltage $V_{DSAT}$.

In this regard, FIG. 2A depicts a gain versus power graph that illustrates related art stage biasing using a constant bias current, which results in a large distortion inflection point and small signal gain variation over design corners. For example, in one design corner such as temperature gain, compression only occurs, and in another design corner such as process, a small expansion followed by gain compression occurs. In yet another, design corner a relatively large gain expansion followed by a gain compression will occur. Thus, it is relatively very hard to achieve linearization with an amplifier stage that has such a vastly different behavior over operating temperature.

Another way of biasing the amplifier stage is known as constant transconductance, which is also known as constant gm biasing. FIG. 2B is a gain versus power graph illustrating a related art constant gm bias that offers a constant small signal gain over design corners. In effect, constant gm bias provides a variable current that is dependent on the design corner and the temperature at which the amplifier stage is operating. As a result, constant gm biasing achieves a constant gain for the amplifier stage. Referring to the gain versus power graph of FIG. 2B, constant gain is evident in that at low power, all of the gain curves are tightly grouped, but gain distortion greatly varies as power increases. As shown in FIG. 2B, the bottom gain curve remains fairly flat until a relatively late compression, whereas the middle gain curve expands by a small amount, then compresses, while the top gain curve expands early and relatively greatly before compression. Therefore, in terms of gain distortion, only the small signal gain has been aligned and a variable inflection point remains. Thus, the goal of gain inflection point alignment has not been achieved with constant gm biasing.

FIG. 2C is a gain versus power graph illustrating variable gain with a constant inflection point that is achieved by embodiments of the present disclosure. As shown, the gain curves have the same inflection point such that expansion will start at relatively the same power level. Moreover, the slopes for different design corners will be parallel. However, gain will remain variable because it is not possible to achieve both gain flatness and a constant inflection point. In general, linearization is achieved by keeping the inflection point of the gain constant in contrast to maintaining constant gain. For linearization, two coupled amplifier stages such as a driver stage and an output stage must have a relatively precisely determined inflection point. Once the variable inflection points have been aligned into a precisely determined inflection point, the variable gain can be corrected with techniques described later within the present disclosure.

FIG. 3A is a simplified schematic diagram of an amplifying system 24 of the present disclosure that includes a driver stage 26 with constant compression bias circuitry 28 and an output stage 30 having constant expansion bias circuitry 32. In contrast, FIG. 3B is a simplified schematic diagram of an amplifying system 34 of the present disclosure that includes a driver stage 36 with constant expansion bias circuitry 38 and an output stage 40 having constant compression bias circuitry 42. FIG. 3C is a graph of gain versus power for the driver stage 26 of FIG. 3A and the output stage 40 of FIG. 3B. FIG. 3D is a graph of gain versus power for the driver stage 36 of FIG. 3B and the output stage 30 of FIG. 3A. The inflection points in the gain curves for the driver stages 26 and 36 are matched with the inflection points in the gain curves for the output stages 30 and 40. The slopes of the gain curves due to compression and expansion are also matched. The results of matching inflection points and matching gain slopes are illustrated in the FIG. 3E.

FIG. 3E is a graph of total gain versus power for the output stage 30 of FIG. 3A and the output stage 40 of FIG. 3B. As illustrated in FIG. 3E, the total gain $G_{TOTAL}$ is mostly flat with the exception of a small ripple that may occur near each inflection point alignment. These small ripples are due to slight inflection point misalignments that are caused by practical limitations in components that make up an amplifying system, such as amplifying systems 24 and 34. However, small ripples of less than 0.1 dB per dB are usually tolerable to a point that linearity of the amplifying system is maintained over design corners such as process, temperature and supply voltage.

FIGS. 4A-F illustrate what happens when slight misalignments occur in the expansion and compression inflection points. FIG. 4A is a graph of early expansion gain versus power and FIG. 4B is a graph of late compression gain versus power. FIG. 4C is a graph of total gain versus power that illustrates a bump up ($+\Delta G$) in total gain as a result of misalignment of the early expansion gain of FIG. 4A and the late compression gain of FIG. 4B.

FIG. 4D is a graph of late expansion gain versus power and FIG. 4E is a graph of early compression gain versus power. FIG. 4F is a graph of total gain versus power that illustrates a bump down ($-\Delta G$) in total gain as a result of misalignment of the late expansion gain of FIG. 4D and the early compression gain of FIG. 4F.

The $\pm\Delta G$ bumps are referred to as AM-AM distortion. Practically all modulation types have a level of AM-AM distortion that can be tolerated. For example, wideband code division multiple access (W-CDMA) modulation can tolerate up to 0.1 dB per dB of slight variations of gain. Therefore, slight misalignments of gain inflection points will not disrupt the normal operation of a functional amplifying system.

FIGS. 5A-5F illustrate the mechanism of expansion and compression in an amplifier stage 44 which can be either the driver stage 36 or the output stage 40 depicted in FIG. 3B. Metal oxide semiconductor (MOS) amplifying stages such as bulk-CMOS, silicon-on-insulator CMOS (SOI-CMOS), and n-type MOS (NMOS) typically exhibit compression starting at a transition point between the class-A and class-AB operating regions. This happens when an instantaneous input voltage goes below a device threshold voltage, which is usually the case in common source amplifying stages. To address the issue of compression starting at a transition point between the class-A and class-AB operating regions, the amplifier stage 44 can be biased using at least two different techniques. A first biasing technique is to bias the amplifier stage 44 to a relatively high level of drain saturation voltage $V_{DSAT}$.

FIG. 5B is a graph of signal voltage versus time illustrating a clipping effect as a signal voltage increases to a point about a bias level $V_{BIAS}$ that a negative swing of the signal voltage intersects a threshold voltage $V_{TH}$ of the amplifier of FIG. 5A. In this case, the first biasing technique is to bias the amplifier stage 44 to a relatively high level of drain saturation voltage $V_{DSAT}$. In contrast, a second biasing technique is to bias the amplifier stage 44 to a relatively low level, which provides a relatively very low level of $V_{DSAT}$. In this regard, FIG. 5C depicts a graph of signal voltage versus time illustrating a clipping effect as a supply voltage clips to a point such that a positive swing of the signal voltage intersects the supply voltage of the amplifier stage 44 of FIG. 5A.

FIGS. 5D-5F depict gain curves that result from the first and second biasing techniques pertaining to FIGS. 5B and 5C. FIG. 5D is a graph of gain versus power showing a late expansion during a class A-AB transition for the amplifier of FIG. 5A. In FIG. 5D, a relatively small amount of gain remains relatively flat until a relatively small reduction in gain occurs as a class A-AB transition takes place. In effect, the class A-AB transition takes place as the amplifier stage 44 turns off as a signal voltage swings to intersect the threshold voltage of the amplifier stage 44.

Early expansion of the gain can mask the class-AB transition. Such a case is shown in FIG. 5E, which depicts a small flat gain changing into an expansion, which in turn changes into a compression as an input signal grows, as shown in FIGS. 5B and 5C. However, as signal power increases, the bias point moves up in level and the gain of the amplifier stage 44 increases. As such, a gain expansion will always occur, but a small amount of compression will take place if the amplifier stage 44 is biased very low. In contrast, if the amplifier stage 44 is biased to a relatively much higher level, there will be relatively more headroom for the signal swings. However, as the supply voltage signal approaches the gain will start compressing. Such a case is illustrated in FIG. 5F, which is a graph of gain versus power showing a class A-AB transition for the amplifier stage 44 with compression only.

FIGS. 6A-6D include a schematic of an amplifying system 46 along with voltage versus time graphs of three exemplary cases illustrating the operation of amplifying system 46. FIG. 6A is the schematic of amplifying system 46 that includes an amplifier stage 48, a reference headroom voltage generator 50, and constant distortion bias circuitry

52. In general, the bias of the amplifier stage 48 varies as process and temperature vary. Embodiments such as amplifying system 46 provide a bias such that a voltage difference (i.e., $V_{HEADROOM}$) between a bias point and a threshold voltage of the amplifier stage 48 is maintained at a constant level. In this way, constant headroom will be maintained as the bias level for the amplifier stage 48 translates up and down. In this case, headroom determines how close an input signal or output signal can swing without clipping against a threshold voltage $V_{TH}$.

FIG. 6B is a graph of signal voltage versus time wherein the signal voltage is offset by a low bias voltage while having voltage headroom maintained by the amplifying system 46 of FIG. 6A. The threshold voltage $V_{TH}$ of the amplifier stage 48 is a cut-off limit for class A-to-class AB operation.

FIG. 6C is a graph of signal voltage versus time wherein the signal voltage is offset by a typical centered bias voltage while having voltage headroom maintained by the amplifying system 46 of FIG. 6A. In this case, the constant distortion bias circuitry 52 shifts the bias upwards from the low bias depicted in FIG. 6B.

FIG. 6D is a graph of signal voltage versus time, wherein the signal voltage is offset by a relatively high bias voltage while having voltage headroom maintained by the amplifying system 46 of FIG. 6A. In this case, the constant distortion bias circuitry 52 shifts the bias upwards from the low bias depicted in FIG. 6C. The graphs provided in FIGS. 6B, 6C, and 6D are dependent upon the input power level because whenever an input signal voltage received by the amplifier stage 48 goes below the voltage threshold of the amplifier stage 48, the amplifier goes into cutoff.

In this regard, FIGS. 7A-7E include a schematic of an amplifying system 54 along with gain versus power graphs that illustrate early expansion and late expansion for low gain and high gain situations. In particular, FIG. 7A is the schematic of the amplifying system 54 wherein a first saturation voltage $V_{DSAT1}$ of a driver stage 56 is related to a second saturation voltage $V_{DSAT2}$ of an output stage 58 that receives a signal from the driver stage 56. A first optional stage 60 can be added before the driver stage 56 and a second optional stage 62 can be added after the driver stage 56 to provide impedance matching.

The power level at which a distortion inflection point occurs depends on the saturation voltage $V_{DSAT}$ and signal swing, which in turn depends on input signal level and gain at a given point in the signal path. The gain between the input of the driver stage 56 and the input of the output stage 58 sets a relationship between the first saturation voltage $V_{DSAT1}$ and the second saturation voltage $V_{DSAT2}$ such that the inflection point of the compression for the driver stage 56 and the inflection point of the expansion for the output stage 58 are aligned.

FIG. 7B is a graph of gain versus power for a low gain followed by an early expansion. Early expansion in either the driver stage or the output stage 58 is achieved with a small bias current which gives a small quiescent gain.

FIG. 7C is a graph of gain versus power for a high gain followed by an early compression. Early compression in a stage requires a small $V_{DSAT}$ which in turns results in a large gm and thus a large small signal gain.

FIG. 7D is a graph of gain versus power for high gain followed by late expansion. FIG. 7E is a graph of gain versus power for low gain followed by late compression. In each of the cases depicted in FIGS. 7B-7E, the gain across the driver stage 56 is set to provide an equal amount of headroom so that the inflection points associated with distortion will be collocated with regard to power. Once the inflection points are aligned, the expansion and compression distortion will cancel.

FIG. 8 is a schematic diagram of an exemplary embodiment of an amplifying system 64 having driver constant distortion bias circuitry 66 and output stage constant distortion bias circuitry 68 in a signal path 70 having a variable gain driver stage 72 and a variable gain output stage 74. In numerous, but not all applications having amplifying systems, variable gain is useful. In some applications, the variable gain is continuous discrete gain steps. In other applications, the variable gain is non-continuous. For example, many applications have various gain settings such as high gain and low gain settings that are discrete steps. When the gain of the variable gain driver stage 72 changes the inflection points for expansion distortion and compression distortion become misaligned. As a result, the driver constant distortion bias circuitry 66 and the output stage constant distortion bias circuitry 68 must be readjusted. As such, a digital input/output (I/O) 76 is included to pass bias values from an external processor (not shown) to a distortion alignment control 78 that generates analog bias adjustment signals that feed into the driver constant distortion bias circuitry 66 and the output stage constant distortion bias circuitry 68. The digital I/O 76 also passes gain values to a gain control 80 that adjusts the gain of both the driver stage 72 and the output stage 74. In an alternative embodiment, the bias values are provided to the distortion alignment control 78 by way of an optional memory 82. In either embodiment, the relationship between the first saturation voltage $V_{DSAT1}$ and the second saturation voltage $V_{DSAT2}$ is maintained as the gain changes from one setting to another.

Figure 9:
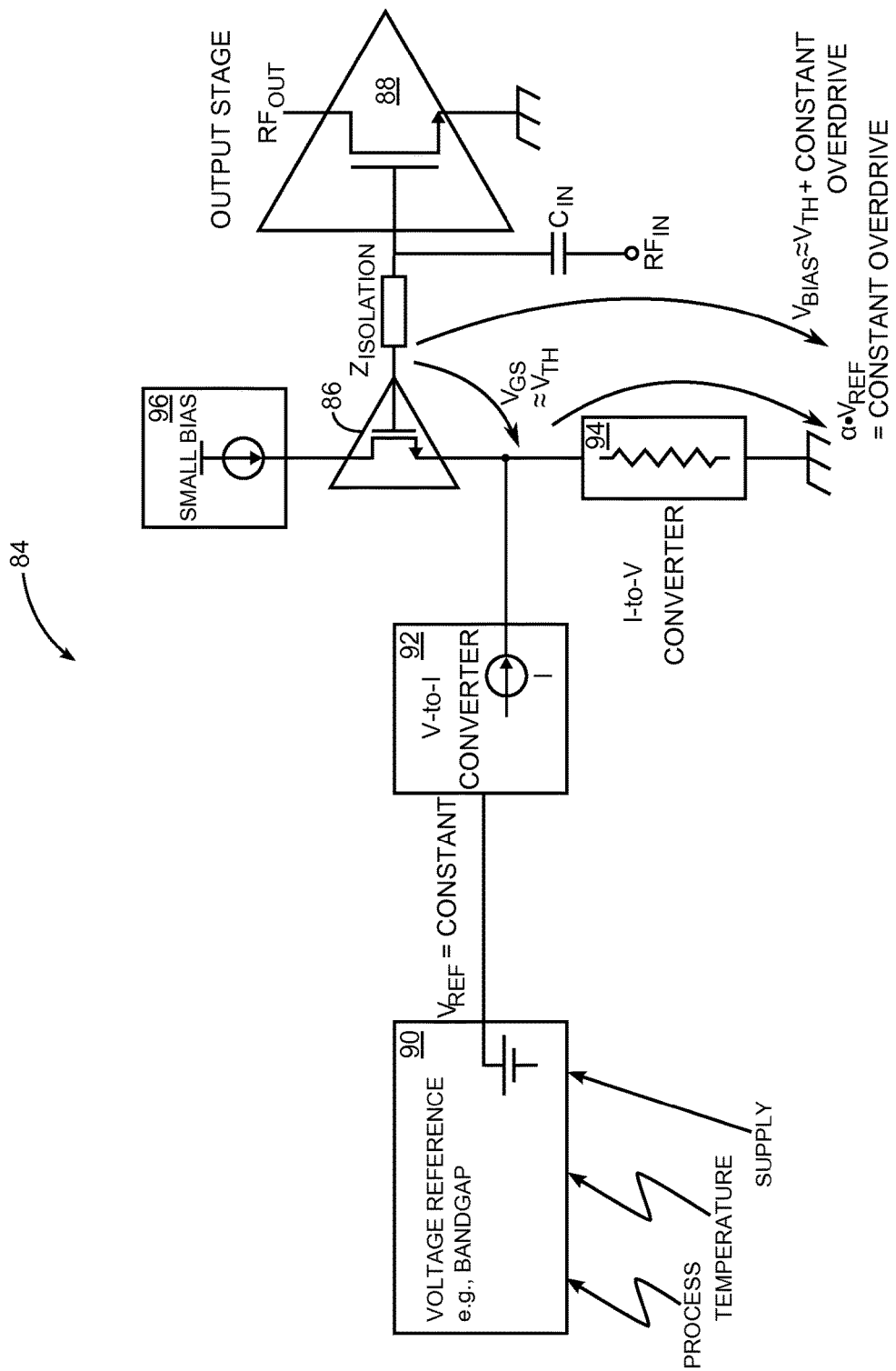
FIG. 9 is a schematic diagram of an exemplary embodiment of an amplifying system having constant distortion bias for grounded source amplifier stages without RF degeneration.

Many types of amplifying stages exist. Therefore, the constant distortion bias circuit is adaptable for a configuration of a particular amplifier stage. FIG. 9 is a schematic diagram of an exemplary embodiment of an amplifying system 84 having constant distortion bias for grounded source amplifier stages such as a bias stage 86 and output stage 88 without implementing any RF degeneration. In general, maximum power efficiency cannot be realized if degeneration is applied to the output stage 88. As a result, a degeneration impedance element should not be placed in a source or emitter path of the output stage 88.

The amplifying system 84 does not include a degeneration impedance element. Instead, the bias of the output stage 88 is fixed versus the threshold voltage $V_{TH}$ of the output stage 88. The threshold voltage $V_{TH}$ varies with process and temperature, and with a CMOS-based amplifier, the variation of the threshold voltage $V_{TH}$ can be relatively great. For example, the threshold voltage $V_{TH}$ can vary by ±150 mV, and over temperature, depending on the bias, the threshold voltage $V_{TH}$ can vary as much as from −1.5 mV per degree Celsius to 2 mV per degree Celsius. As a result, biasing of the output stage 88 must maintain constant headroom between a bias voltage level and the threshold voltage $V_{TH}$.

In this regard, the amplifying system 84 employs a voltage reference 90 such as a bandgap reference to provide a bandgap voltage that is independent of process and temperature. The amplifying system 84 further includes a voltage-to-current (V-to-I) converter 92 that converts the bandgap voltage into a current I, that in turn is injected into a current-to-voltage (I-to-V) converter 94. In this exemplary case, the I-to-V converter 94 is a resistor coupled to a source of the bias stage 86. However, it is to be understood that the I-to-V converter 94 can also be a transconductance stage. In either case, the voltage established at the source of the bias stage 86 sets the bias for the output stage 88.

The bias stage 86 is itself biased at a very low current by a small bias 9G. The very low current is on the order of microamperes, which is just enough to turn the bias stage 86 on. As a result of the bias stage 86 being barely on, a gate to source voltage $V_{GS}$ will be approximately equal to the threshold voltage $V_{TH}$. Therefore, the bias stage 86 functions as a tracking threshold voltage level shifter.

In an exemplary case, the bandgap voltage is generated from silicon, which has a bandgap voltage of 1.2 V. If, for example, a constant voltage of 0.3 V is needed, the current I and/or the I-to-V converter 94 is scaled to provide one quarter of the bandgap voltage. The threshold voltage $V_{TH}$ and the constant voltage of 0.3 V combine to track with process and temperature. This combined voltage is used to bias the output stage 88. As a result of this bias, the output stage 88 will maintain a constant 0.3 V headroom from a turnoff voltage of the output stage 88.

The amplifying system 84 includes isolation impedance $Z_{ISOLATION}$ that provides isolation between the bias stage 86 and the output stage 88. An input capacitor $C_{IN}$ is also included to provide DC isolation between the output stage 88 and an RF input $RF_{IN}$.

Figures 10A, 10B:
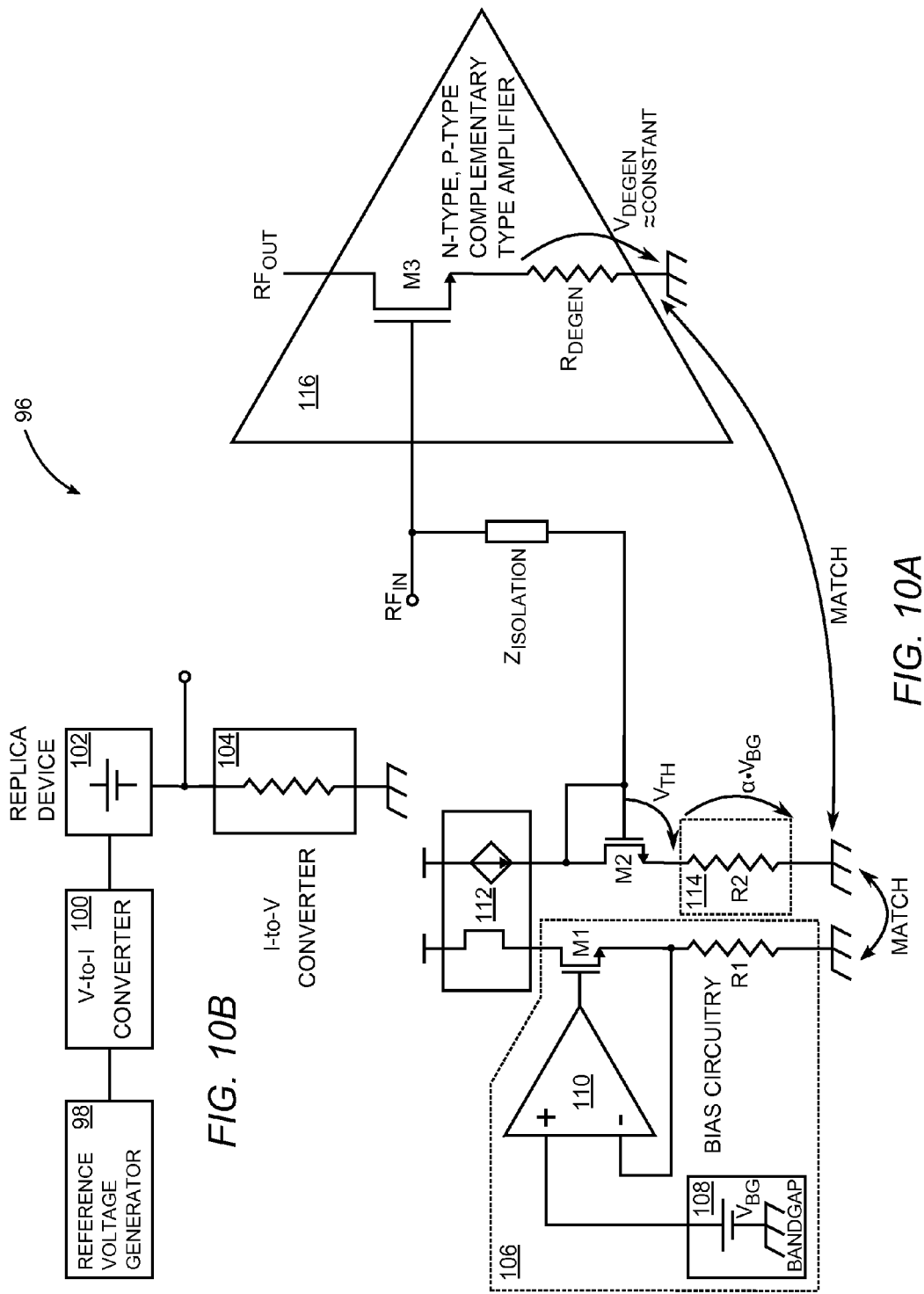
FIGS. 10A and 10B are schematic diagrams of an exemplary embodiment of an amplifying system having constant distortion bias for amplifier stages with RF degeneration.

FIGS. 10A and 10B make up a schematic diagram of an exemplary embodiment of an amplifying system 96 having constant distortion bias for amplifier stages with RF degeneration. Amplifying system 96 is particularly useful in providing a constant distortion bias for driver stages because compared to output stages, driver stages do not operate at high power and are not typically required to operate at high efficiency. High linearity is generally more important than efficiency for driver stages. High linearity is particularly important for improved noise performance.

FIG. 10B is a simplified block diagram that illustrates the function of bias circuitry depicted in FIG. 10A. Functionally, the bias circuitry includes a reference voltage generator 98, a V-to-I converter 100, a replica device 102, and an I-to-V converter 104. In operation, the reference voltage generator 98 provides a voltage that does not vary with process and temperature. The reference voltage is fed into the V-to-I converter 100 and is converted into a corresponding reference current that is injected into the replica device 102. Currents from both the replica device 102 and the V-to-I converter 100 are combined and then fed into the I-to-V converter 104, which in turn outputs a tracking plus headroom voltage that is usable for biasing driver stages.

Turning back to FIG. 10A, a component level reference voltage generator 106 can be realized to function similar to the reference generator 98. The reference voltage generator 106 includes a bandgap reference 108 that provides a reference voltage $V_{BG}$. An operational amplifier 110 receives the reference voltage $V_{BG}$ on a non-inverting input. A first transistor M1 has a gate that is driven by an output of the operational amplifier 110. A source of the first transistor M1 is coupled to a first resistor R1 that is coupled to ground. The source of the first transistor M1 is also coupled to an inverting input of the operational amplifier 110 to provide feedback of a voltage across the first resistor R1. In operation, the voltage across the first resistor R1 is automatically adjusted by the operational amplifier 110 to equal the reference voltage $V_{BG}$.

A V-to-I converter 112 is a voltage controlled current source. A drain of the first transistor M1 is coupled to a control terminal of the V-to-I converter 112 such that a reference current provided by the voltage controlled current source is proportional to the reference voltage $V_{BG}$. A second transistor M2 serves a function similar to the replica device 102 in that a threshold voltage $V_{TH}$ is replicated between a gate and source of the second transistor M2 during operation. An I-to-V converter 114 in the form of a second resistor R2 is coupled between the source of the second transistor M2 and ground. A drain of the second transistor M2 is coupled to the V-to-I converter 112 so that the reference current flows through the second transistor M2 and the second resistor R2. As a result, a voltage across the second resistor R2 is equal to a scaling constant $\alpha$ times the reference voltage $V_{BG}$. The scaling constant $\alpha$ corresponds to the size of the second transistor M2. Moreover, the first resistor R1 and the second resistor R2 are typically a matched pair.

An amplifier stage 116 is biased by the threshold voltage $V_{TH}$ plus $\alpha V_{BG}$. The amplifier stage 116 includes an output transistor M3 that has a source coupled to a degeneration resistor $R_{DEGEN}$. A voltage $V_{DEGEN}$ that develops across the degeneration resistor $R_{DEGEN}$ is approximately constant. In this case, the constant distortion bias is achieved by way of the VBG/R2 bias current and the degeneration resistor $R_{DEGEN}$ that is matched with the second resistor R2.

Figure 11:
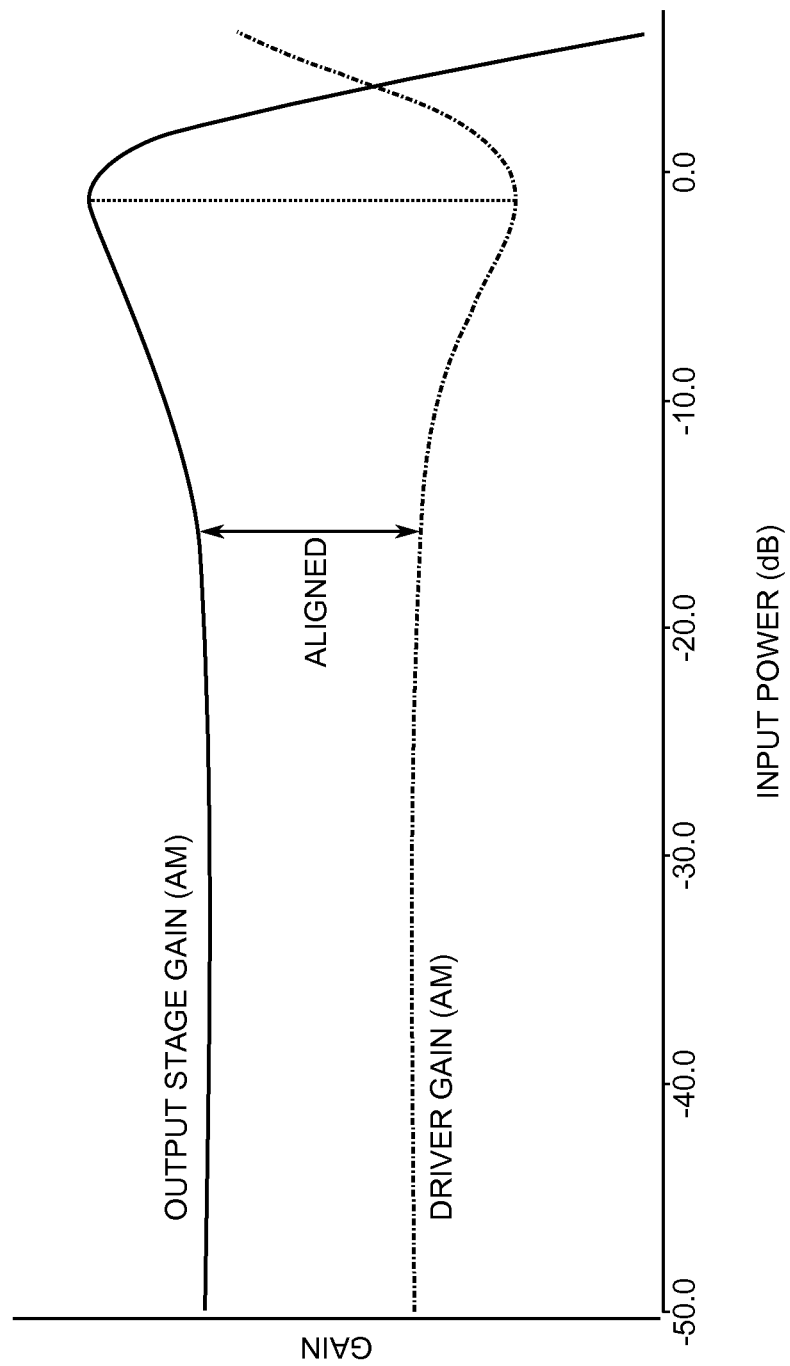
FIG. 11 is a graph of output power versus input power for a driver stage and an output stage having open loop A.M. linearization using constant distortion bias.

FIG. 11 is a graph of gain versus input power for a driver stage and an output stage having open loop A.M. linearization using constant distortion bias. A gain curve represented in solid line depicts the gain of an output stage, such as output stage 58 (FIG. 7). In this case, the gain starts at a relatively low level, and then, at a moderate power level, the gain expands until compression takes over. In contrast, another gain curve represented in dashed line depicts the gain if a driver stage, such as amplifier 116 (FIG. 10). The driver gain starts flat and then begins to compress at a moderate power level to compensate for the expansion of the output stage gain. A thin vertical dashed line shows that the distortion peaks are aligned. The alignment is achieved by relating a first saturation voltage $V_{DSAT1}$ of a driver stage a second saturation voltage $V_{DSAT2}$ of an output stage using a driver constant distortion bias and an output stage constant distortion bias.

Figure 12:
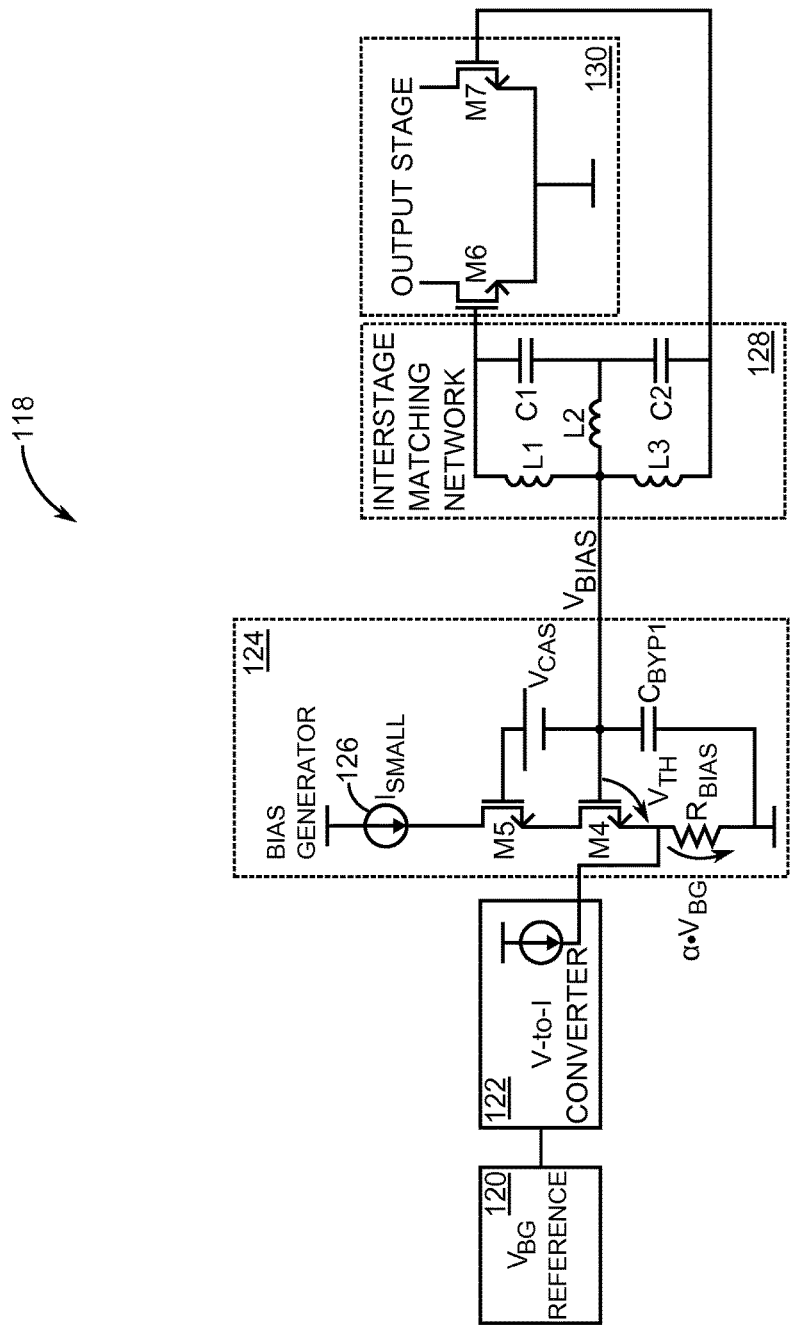
FIG. 12 is a schematic diagram of an exemplary embodiment of a differential output amplifier stage with constant distortion bias.

FIG. 12 is a schematic diagram of an exemplary embodiment of a differential output amplifier stage 118 with constant distortion bias. In this exemplary embodiment, a bandgap voltage reference 120 generates the reference voltage $V_{BG}$, which is passed to a V-to-I converter 122 that converts the reference voltage $V_{BG}$ into a reference current. A bias generator 124 receives the reference current and passes it through a resistor $R_{BIAS1}$ to generate a scaled reference voltage $\alpha V_{BG}$. The bias generator 124 also includes a replica device M4 having a source coupled to the resistor $R_{BIAS1}$. The voltage threshold $V_{TH}$ is generated across the reference device M4 from gate to source. A bypass capacitor $C_{BY1}$ is coupled from the gate and across the resistor $R_{BIAS1}$ to prevent stray signals from combining with the reference current.

A fifth transistor M5 is coupled in a cascode configuration with the replica device M4. The fifth transistor M5 is biased by a voltage $V_{CAS}$. A small current source 126 generates a relatively small current on the order of microamperes to turn on the fifth transistor M5 very slightly.

An interstage matching network 128 is coupled between an output stage 130 made up of sixth transistor M6 and a seventh transistor M7 that are coupled in a differential configuration. The interstage matching network 128 depicted in FIG. 12 is exemplary and is made up of inductors L1, L2, and L3 and capacitors C1 and C2. The output stage 128 receives a bias voltage $V_{BIAS}$ that is made up of the threshold voltage $V_{TH}$ plus the scaled reference voltage $\alpha V_{BG}$. As a result of the bias voltage $V_{BIAS}$, the output stage 130 will maintain a constant headroom from a turnoff voltage of the output stage 130 over process and temperature. However, gain variation remains a problem.

Figure 13A:
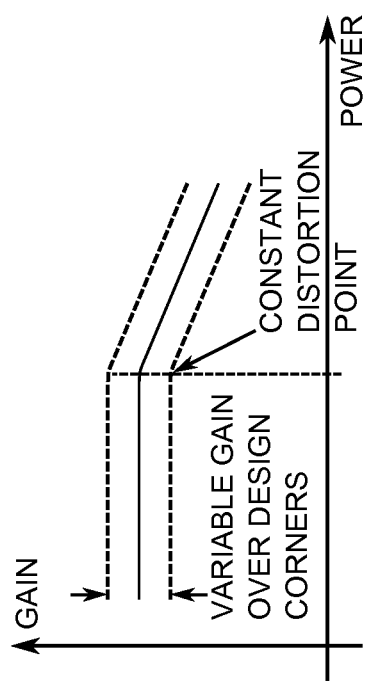
FIG. 13A is a graph of gain versus power for compressive constant distortion biased amplifier stages.
Figure 13B:
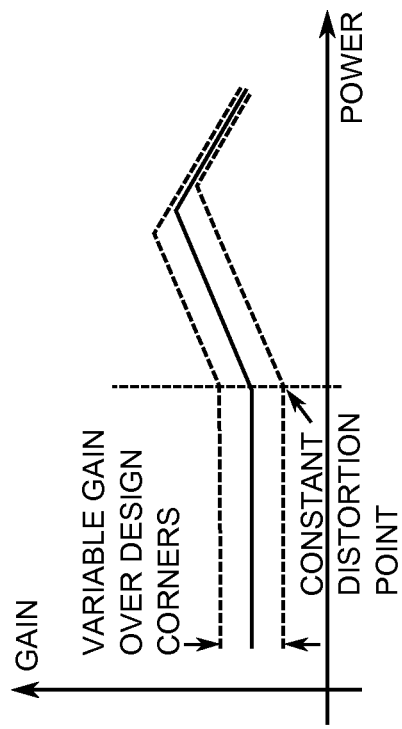
FIG. 13B is a graph of gain versus power for expansive constant distortion biased amplifier stages.

In this regard, FIGS. 13A and 13B illustrate the problem of gain variation. FIG. 13A is a graph of gain versus power for compressive constant distortion biased amplifier stages, and FIG. 13B is a graph of gain versus power for expansive constant distortion biased amplifier stages. While offering a fixed distortion inflection point as shown in FIG. 13, the constant distortion bias results in a significant gain variation over the design corners. However, a variable gain in the signal path is generally not acceptable for power amplifier (PA) applications because most PAs have a specification for how much maximum gain variation is permissible. For example, typical specifications would be ±3 dB, ±5 dB, or ±10 dB. Thus, a gain stabilization circuit needs to be implemented for the constant distortion bias schemes. In particular, a gain stabilization loop for constant biased amplifier stages will provide the needed gain control.

FIG. 14A is a schematic of an exemplary amplifying system 132 having a gain stabilization loop for constant biased amplifier stages using RF segmentation control. The amplifying system 132 includes a variable gain amplifier 134 having an input $RF_{IN}$ and an output $RF_{OUT}$. Constant distortion bias circuitry 136 is coupled to the input $RF_{IN}$ to maintain a constant headroom as the bias level for the variable gain amplifier stage 134 translates up and down. The gain stabilization loop includes a gain sensor 138 and automatic constant distortion bias circuitry 140 that are coupled in series. An input of the gain sensor 138 is coupled to the input $RF_{IN}$. However, the input of the gain sensor 138 can be coupled to the output $RF_{OUT}$ in an alternative embodiment. Moreover, the gain sensor 138 can be a relatively small replica stage that draws practically negligible power.

The automatic constant distortion bias circuitry 140 is coupled between an output of the gain sensor 138 and a gain control input of the variable gain amplifier 134. In effect, the automatic constant distortion bias circuitry 140 is a comparator that compares a gain sense signal output from the gain sensor 138 against a set point and in turn automatically adjusts the gain of the variable gain amplifier 134 such that the gain remains constant.

FIG. 14B is a schematic of an exemplary amplifying system 142 having a gain stabilization loop for constant biased amplifier stages using bias control. The amplifying system 142 does not include a variable gain amplifier, but instead includes a gain amplifier 144 that is controlled by adjustable constant distortion bias circuitry 146 that is adjustable via the automatic constant distortion bias circuitry 140. In operation, a bias ratio between a first bias set by the adjustable constant distortion bias circuitry 146 and a second bias set by the automatic constant distortion bias circuitry 140 is continuously changed such that an effective gain of the gain stage 144 remains constant.

FIG. 15A is a schematic of an equivalent amplifier output stage 148 made up of amplifier segments 150-1, 150-2, and 150-N that are selectively turned on and off by a digital segmentation control 152. The equivalent amplifier output stage 148 provides different steps of gain for cases requiring different load lines. Signals output from the amplifier segments 150-1, 150-2, and 150-N are combined at a summation node 154. It is to be understood that while amplifier segmentation is primarily directed to output stages, other amplifier stages such as a driver stage may benefit from amplifier segmentation. However, for driver stages, a gain degeneration configuration is more appropriate in many instances.

In this regard, FIG. 15B is a schematic of an exemplary driver stage 156 with gain degeneration implemented using a variable degeneration resistance 158 that is controlled by a gain control 160. In operation, the gain control 160 receives a gain set point from external circuitry (not shown) coupled to a control input $CTRL_{IN}$. In turn, the gain control 160 adjusts the variable degeneration resistance 158 such that a desired gain is achieved. The gain control 160 can be either analog or digital. FIG. 15C is a schematic of a resistive digital to analog converter (R-DAC) 162 that can be used to control the gain of the driver stage 156 of FIG. 15B.

Figure 16:
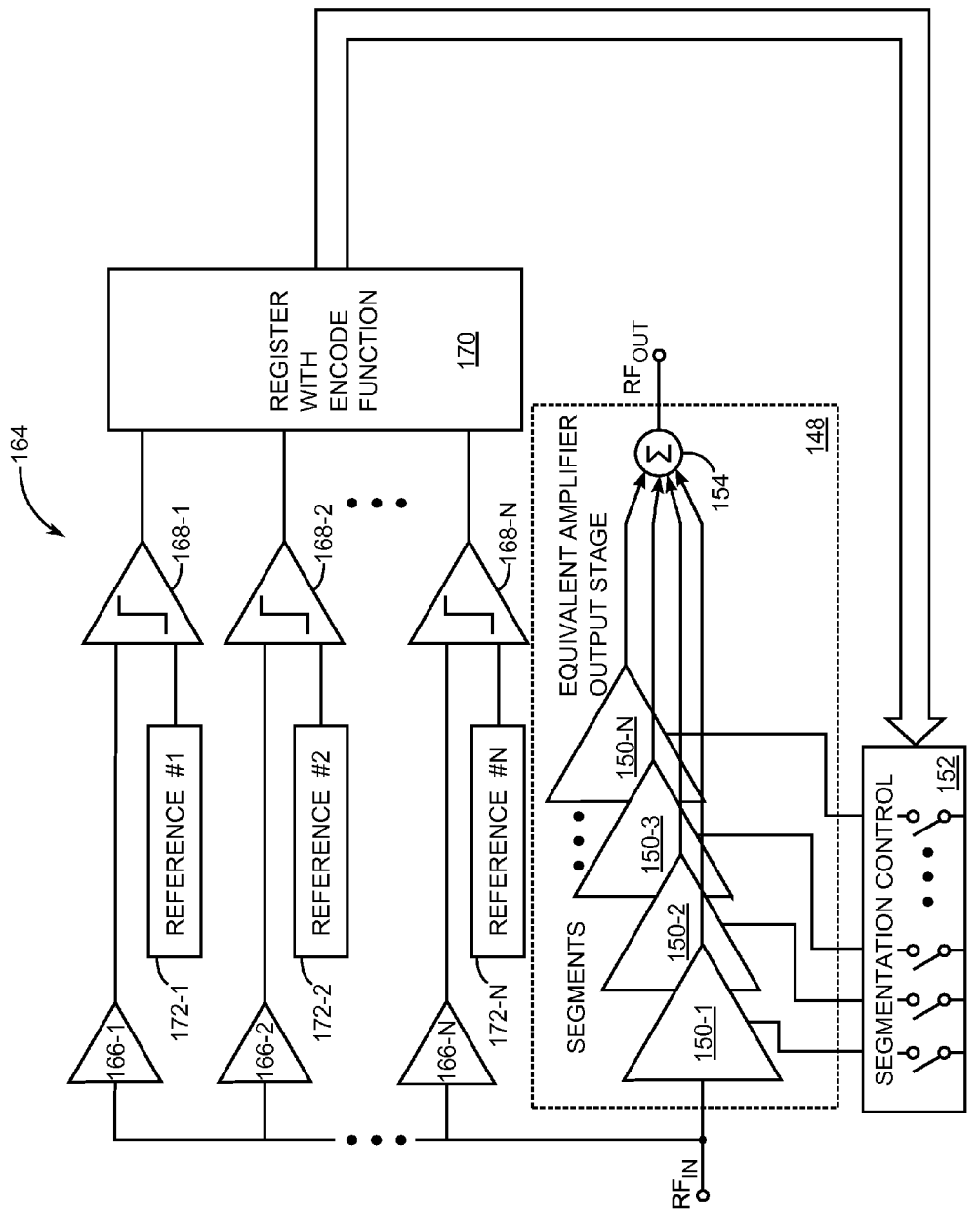
FIG. 16 is a schematic of the equivalent amplifier output stage of FIG. 15A with a constant gain loop that feeds back to the digital segmentation control.

FIG. 16 is a schematic of the equivalent amplifier output stage 148 with a constant gain loop that feeds back to the digital segmentation control 152. The constant gain loop includes a plurality of replica stages 166-1, 166-2, and 166-N having inputs coupled to the input $RF_{IN}$ feeding the equivalent amplifier output stage 148. A plurality of comparators 168-1, 168-2, and 168-N each have a first input coupled between the plurality of replica stages 166-1, 166-2, and 166-N, respectively, and a register 170 that encodes a digital signal that drives the digital segmentation control 152. Threshold voltage references 172-1, 172-2, and 172-N are coupled to a second input of each of the comparators 168-1, 168-2, and 168-N, respectively. The threshold voltage references 172-1, 172-2, and 172-N are provided so that the plurality of comparators 168-1, 168-2, and 168-N can determine whether the gain of each of the plurality of replica stages 166-1, 166-2, and 166-N are above or below a given threshold. The result of each comparison is passed to the register 170 to be encoded to drive the digital segmentation control 152 to select appropriate ones of the amplifier segments 150-1, 150-2, 150-3, through 150-N such that a constant gain for the equivalent amplifier output stage 148 is maintained. In effect, the gain loop components make up a flash analog-to-digital converter (ADC). The plurality of replica stages 166-1, 166-2, and 166-N are located on a same block as the equivalent amplifier output stage 148 in order to achieve a strong thermal coupling with the equivalent amplifier output stage 148.

Figure 17:
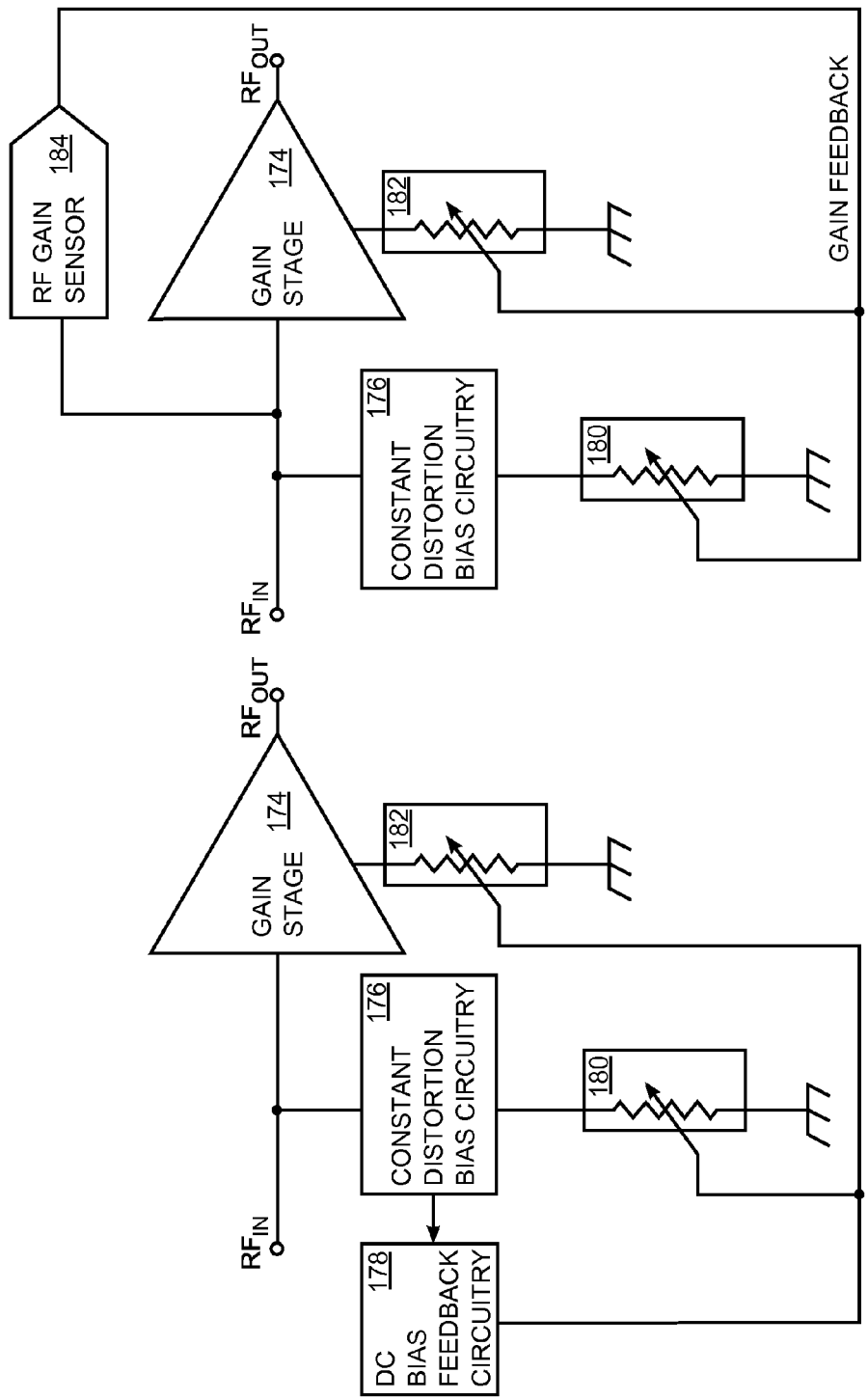
FIG. 17A is a schematic of an exemplary gain stage having a constant gain stabilization loop that is DC bias feedback driven.
FIG. 17B is a schematic of an exemplary gain stage having a constant gain stabilization loop that is RF gain sensing driven.

FIG. 17A is a schematic of an exemplary gain stage 174 having a constant gain stabilization loop that is DC bias feedback driven. Constant distortion bias circuitry 176 coupled to an input $RF_{IN}$ of the gain stage 174 drives DC bias feedback circuitry 178 that in turn drives a variable bias resistance 180 and a variable degeneration resistance 182 to provide constant gain.

FIG. 17B is a schematic of the exemplary gain stage 174 having a constant gain stabilization loop that is RF gain sensing driven. In this case, the DC bias feedback circuitry 178 (FIG. 17A) is replaced with an RF gain sensor 184 that drives the variable bias resistance 180 and the variable degeneration resistance 182 to provide constant feedback.

Figure 18:
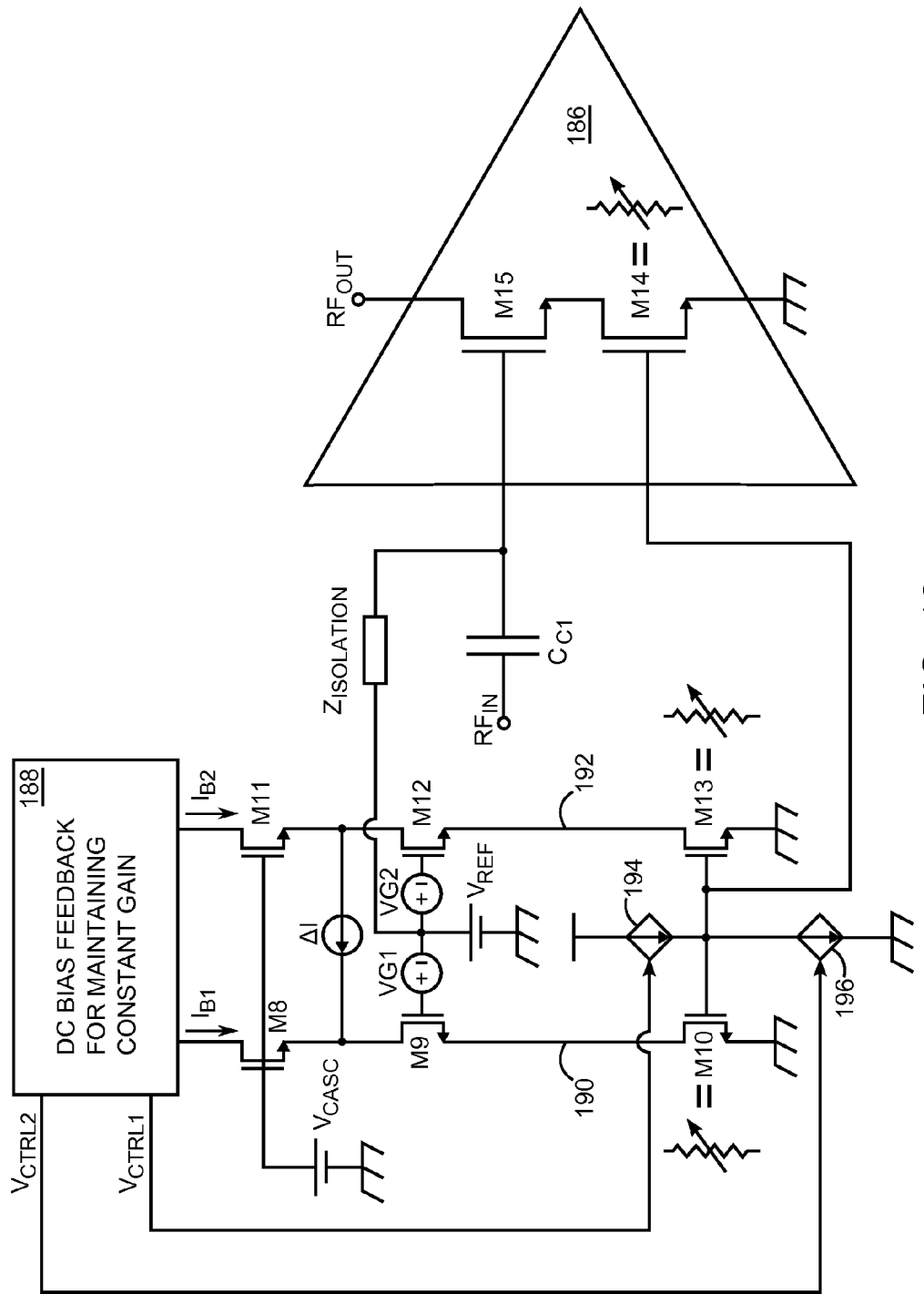
FIG. 18 is a schematic of a gain stage having a DC bias feedback that is driven by a constant drain saturation voltage.

FIG. 18 is a schematic of a gain stage 186 having a DC bias feedback block 188 that is driven by a constant drain saturation voltage. The DC bias feedback block 188 is coupled to a first bias leg 190 having a first bias current $I_{B1}$ and a second bias leg 192 having a second bias current $I_{B2}$. A first control voltage $V_{CTRL1}$ which is responsive to the first bias current $I_{B1}$ and a second control voltage $V_{CTRL2}$ which is responsive to the second bias current $I_{B2}$ are output from the DC bias feedback block 188, and drive a first voltage controlled current source 194 and a second voltage controlled current source 196, respectively. The first bias leg 190 includes cascode coupled transistors M8 and M9 along with a third transistor M10 that functions as a current controlled resistance when driven by the first voltage controlled current source 194.

The second bias leg 192 includes cascode coupled transistors M11 and M12 along with a third transistor M13 that functions as a current controlled resistance when driven by the second voltage controlled current source 196. The second voltage controlled current source 196 also drives a transistor M14 that functions as a degeneration resistance for an output transistor M15 of the gain stage 186. A reference voltage $V_{REF}$ provides bandgap derived bias for the output transistor M15 as well as for transistors M9 and M12 that also have additional bias from voltages VG1 and VG2, respectively. A ΔI current source is coupled between the first bias leg 190 and the second bias leg 192 to relate the currents $I_{B1}$ and $I_{B2}$. A cascode bias voltage $V_{CASC}$ provides bias to transistors M8 and M11. The output transistor M15 receives an RF signal through a coupling capacitor $C_{C1}$ coupled to the RF input $RF_{IN}$.

As a result of the configuration depicted in FIG. 18, the gain stage 186 is biased with a constant offset voltage so that the output transistor M15 will pull constant current. Moreover, the bias currents $I_{B1}$ and $I_{B2}$ are automatically adjusted by the DC bias feedback block 188 to provide a constant on voltage $V_{ON}$ for the output transistor M15.

Figure 19:
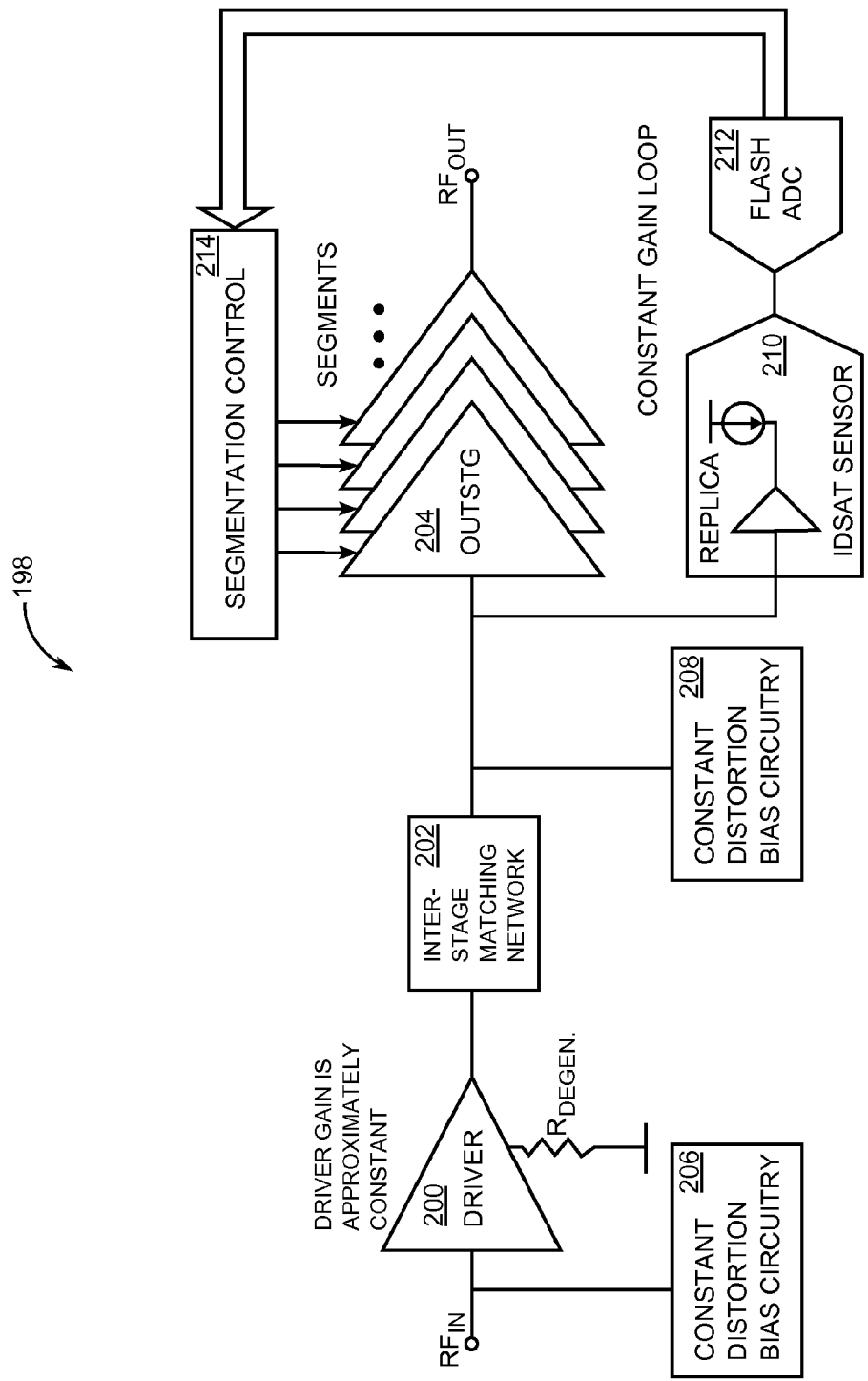
FIG. 19 is a schematic of an exemplary amplifying system that includes a driver stage, an interstage matching network and segmented amplifier output stage.

FIG. 19 is a schematic of an exemplary amplifying system 198 that includes a driver stage 200, an interstage matching network 202 and a segmented amplifier output stage 204. First constant distortion bias circuitry 206 is coupled to an input of the driver stage 200 in order to bias the driver stage 200 with constant distortion. A degeneration resistance $R_{DEGEN}$ is usable to degenerate the gain of the driver stage 200 for increased linearity. Second constant distortion bias circuitry 208 is coupled to an input of the segmented amplifier output stage 204 in order to bias the segmented amplifier output stage 204.

A constant gain loop is made up of a replica stage 210 that functions as a drain saturation IDSAT sensor 210, a flash ADC 212, and a segmentation control 214. The drain saturation IDSAT sensor 210 has an input coupled to the input of the segmented amplifier output stage 204 and an output coupled to the flash ADC 212. In turn, the flash ADC 212 has a digital output coupled to the segmentation control 214. In operation, the drain saturation IDSAT sensor 210 detects a drain saturation current IDSAT that is related to the gain of the segmented amplifier output stage 204. A signal that is proportional to the drain saturation current IDSAT is converted into a digital signal that drives the segmentation control 214 to select appropriate segments to maintain a constant gain.

Those skilled in the art will recognize improvements and modifications to the embodiments of the present disclosure. All such improvements and modifications are considered within the scope of the concepts disclosed herein and the claims that follow.

What is claimed is:

1. An amplifying system comprising:
a first gain stage with a first gain characteristic;
a second gain stage with a second gain characteristic; and
bias circuitry that includes a reference headroom voltage generator and is configured to provide bias responsive to a reference voltage generated by the reference headroom voltage generator such that a voltage difference between a bias point and a threshold voltage of at least one of the first gain stage and the second gain stage is maintained at a constant level to substantially maintain alignment of distortion inflection points between the first gain characteristic and the second gain characteristic to limit total gain variations to less than 0.1 dB per dB of output stage power during operation for an input power to the first gain stage that ranges from −50 dB to 0 dB.

2. The amplifying system of claim 1 wherein the first gain characteristic is expansive and the second gain characteristic is compressive.

3. The amplifying system of claim 1 wherein the first gain characteristic is compressive and the second gain characteristic is expansive.

4. The amplifying system of claim 1 wherein the bias circuitry is configured to further substantially maintain alignment of the distortion inflection points between the first gain characteristic and the second gain characteristic over design corners by providing substantially constant headroom between quiescent bias voltage and turnoff of the first gain stage and the second gain stage.

5. The amplifying system of claim 1 wherein the first gain stage is configured to provide RF degeneration control of gain.

6. The amplifying system of claim 1 wherein the second gain stage comprises a plurality of gain segments with a segmentation control.

7. The amplifying system of claim 1 wherein the bias circuitry is further configured to substantially maintain alignment of distortion inflection points between the first gain characteristic and the second gain characteristic during operation by setting a substantially constant saturation voltage for each of the first gain stage and the second gain stage over design corners.

8. The amplifying system of claim 1 wherein the first gain stage is a driver stage that drives the second gain stage.

9. The amplifying system of claim 8 wherein the second gain stage is an output stage.

10. The amplifying system of claim 1 wherein the bias circuitry is further configured to provide a constant distortion bias with degeneration for at least one of the first gain stage and the second gain stage.

11. The amplifying system of claim 1 wherein the first gain stage and the second gain stage are both variable gain amplifiers.

12. The amplifying system of claim 1 further including a gain control loop wherein at least one of the first gain stage and the second gain stage is a variable gain stage that is configured to adjust gain in response to a feedback signal generated by the gain control loop.

13. The amplifying system of claim 12 wherein the gain control loop includes a gain sensor coupled in series with automatic constant distortion bias circuitry that is configured to receive a gain measurement signal from the gain sensor and generate the feedback signal.

14. The amplifying system of claim 1 further including a bias control loop wherein at least one of the first gain stage and the second gain stage is configured to adjust gain in response to the feedback signal generated by the bias control loop.

15. The amplifying system of claim 14 wherein the bias control loop includes a gain sensor coupled in series with automatic constant distortion bias circuitry that is configured to receive a gain measurement signal from the gain sensor and drive adjustable constant distortion bias circuitry to generate the feedback signal.

16. The amplifying system of claim 1 wherein the first gain stage is a driver stage that is configured to drive the second stage that is an output stage made up of a segmented amplifier controlled by a segmentation control driven by a feedback signal generated by a constant gain loop.

17. The amplifying system of claim 16 wherein the constant gain loop comprises a gain sensor and a flash analog-to-digital converter (ADC) that drives the segmentation control in response to a gain measurement signal generated by the gain sensor.

18. A method for an amplifying system comprising:
providing a first gain stage with a first gain characteristic;
providing a second gain stage with a second gain characteristic;
providing a reference headroom voltage generator;
biasing the first gain stage and the second gain stage in response to a reference voltage generated by the reference headroom voltage generator to provide a bias such that a voltage difference between a bias point and a threshold voltage of at least one of the first gain stage and the second gain stage is maintained at a constant level to substantially maintain alignment of distortion inflection points between the first gain characteristic and the second gain characteristic to limit total gain variations to less than 0.1 dB per dB of output stage power during operation for an input power to the first gain stage that ranges from −50 dB to 0 dB.

19. The method for the amplifying system of claim 18 wherein the first gain characteristic is expansive and the second gain characteristic is compressive.

20. The method for the amplifying system of claim 18 wherein the first gain characteristic is compressive and the second gain characteristic is expansive.

21. The method for the amplifying system of claim 18 further comprising biasing the first gain stage and the second gain stage to maintain alignment of the distortion inflection points between the first gain characteristic and the second gain characteristic over design corners.

22. The method for the amplifying system of claim 21 further comprising biasing the first gain stage and the second gain stage to maintain substantially constant headroom between quiescent bias voltage and turnoff of the first gain stage and the second gain stage.

23. The method for the amplifying system of claim 18 further comprising controlling gain of the first gain stage with RF degeneration.

24. The method of the amplifying system of claim 18 further comprising driving the second gain stage with the first gain stage.

25. The method of the amplifying system of claim 24 wherein the second gain stage comprises a plurality of gain segments with a segmentation control.

26. The method of the amplifying system of claim 18 further comprising setting a substantially constant saturation voltage for each of the first gain stage and the second gain stage to substantially maintain alignment of distortion inflection points between the first gain characteristic and the second gain characteristic over design corners during operation.

27. The method of the amplifying system of claim 18 further comprising biasing at least one of the first gain stage and the second gain stage to provide a constant distortion bias with degeneration for at the least one of the first gain stage and the second gain stage.

* * * * *